(12) United States Patent
Ichikawa et al.

(10) Patent No.: US 11,285,536 B2
(45) Date of Patent: Mar. 29, 2022

(54) FILM-SHAPED FIRED MATERIAL, AND FILM-SHAPED FIRED MATERIAL WITH SUPPORT SHEET

(71) Applicant: LINTEC CORPORATION, Tokyo (JP)

(72) Inventors: Isao Ichikawa, Tokyo (JP); Hidekazu Nakayama, Tokyo (JP)

(73) Assignee: LINTEC Corporation, Tokyo (JP)

(*) Notice: Subject to any disclaimer, the term of this patent is extended or adjusted under 35 U.S.C. 154(b) by 0 days.

(21) Appl. No.: 16/608,288

(22) PCT Filed: Mar. 15, 2018

(86) PCT No.: PCT/JP2018/010222
§ 371 (c)(1),
(2) Date: Oct. 25, 2019

(87) PCT Pub. No.: WO2018/198570
PCT Pub. Date: Nov. 1, 2018

(65) Prior Publication Data
US 2020/0376549 A1    Dec. 3, 2020

(30) Foreign Application Priority Data

Apr. 28, 2017 (JP) ............... JP2017-090714
Sep. 20, 2017 (JP) ............... JP2017-179797
Oct. 2, 2017 (JP) ............... JP2017-192821

(51) Int. Cl.
*B22F 3/10* (2006.01)
*B22F 5/00* (2006.01)
(Continued)

(52) U.S. Cl.
CPC ............ *B22F 3/1021* (2013.01); *B22F 5/006* (2013.01); *B22F 7/04* (2013.01); *H01L 24/29* (2013.01);
(Continued)

(58) Field of Classification Search
CPC .......... B22F 3/1021; B22F 5/006; B22F 7/04; B22F 2201/40; B22F 2301/255;
(Continued)

(56) References Cited

U.S. PATENT DOCUMENTS

2003/0161784 A1    8/2003  Okusako et al.
2017/0369744 A1*   12/2017  Sugo ..................... C09J 9/02

FOREIGN PATENT DOCUMENTS

CN    1440833 A    9/2003
CN    1809617 A    7/2006
(Continued)

OTHER PUBLICATIONS

Written Opinion of the International Searching Authority dated May 29, 2018 in International Application No. PCT/JP2018/010222, with English translation, 7 pages.
(Continued)

*Primary Examiner* — Anthony J Zimmer
*Assistant Examiner* — Ricardo D Morales
(74) *Attorney, Agent, or Firm* — Nixon & Vanderhye P.C.

(57) ABSTRACT

A film-shaped fired material of the present invention is a film-shaped fired material 1 which contains sinterable metal particles 10 and a binder component 20, in which a time (A1) after the start of a temperature increase, at which a negative gradient is the highest, in a thermogravimetric curve (TG curve) measured from 40° C. to 600° C. at a temperature-rising-rate of 10° C./min in an air atmosphere and a maximum peak time (B1) in a time range of 0 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample satisfy a relationship of "A1<B1<A1+200 seconds" and a relationship of "A1<2000 seconds".

11 Claims, 7 Drawing Sheets

(51) Int. Cl.
*B22F 7/04* (2006.01)
*H01L 23/00* (2006.01)
(52) U.S. Cl.
CPC .............. *H01L 24/83* (2013.01); *H01L 24/94* (2013.01); *B22F 2201/40* (2013.01); *B22F 2301/255* (2013.01); *B22F 2303/40* (2013.01); *H01L 2224/29239* (2013.01); *H01L 2224/8384* (2013.01)
(58) Field of Classification Search
CPC ...... B22F 2303/40; H01L 24/29; H01L 24/83; H01L 24/94; H01L 2224/29239; H01L 2224/8384
See application file for complete search history.

(56) References Cited

FOREIGN PATENT DOCUMENTS

| | | |
|---|---|---|
| EP | 3 059 740 A1 | 8/2016 |
| JP | 2012-191238 | 10/2012 |
| JP | 2013-214733 | 10/2013 |
| JP | 2014-111800 | 6/2014 |
| JP | 2017-066485 | 4/2017 |
| JP | 2017-069422 | 4/2017 |
| JP | 201707533 A * | 4/2017 ..... H01L 2224/8184 |
| TW | 201642281 A | 12/2016 |

OTHER PUBLICATIONS

Chinese Office Action dated Mar. 19, 2020 in Chinese Application No. 201880027295.8, with English translation of search report, 7 pages.

International Search Report for PCT/JP2018/010222 dated May 29, 2018, 4 pages.

Extended European Search Report dated Dec. 4, 2020 in European Application No. 18790028,7, 6 pages.

Office Action dated May 4, 2021 in Taiwanese Application No. 107110774 with English translation of Search Report, 4 pages.

* cited by examiner

FILM-SHAPED FIRED MATERIAL, AND FILM-SHAPED FIRED MATERIAL WITH SUPPORT SHEET

This application is the U.S. national phase of International Application No. PCT/JP2018/010222 filed on Mar. 15, 2018 which designated the U.S. and claims priority to Japanese Patent Application No. 2017-090714, filed on Apr. 28, 2017, Japanese Patent Application No. 2017-179797, filed on Sep. 20, 2017, and Japanese Patent Application No. 2017-192821, filed on Oct. 2, 2017, the entire contents of which are incorporated herein by reference.

TECHNICAL FIELD

The present invention relates to a film-shaped fired material and a film-shaped fired material with a support sheet.

Priority is claimed on Japanese Patent Application No. 2017-090714, filed on Apr. 28, 2017, Japanese Patent Application No. 2017-179797, filed on Sep. 20, 2017, and Japanese Patent Application No. 2017-192821, filed on Oct. 2, 2017, the content of which is incorporated herein by reference.

BACKGROUND ART

In recent years, with the high voltage and high current of automobiles, air conditioners, and personal computers, the demand for power semiconductor elements (also referred to as powder devices) to be mounted on these has increased. Since a power semiconductor element is used in a high-voltage and high-current environment, generation of heat from the semiconductor element may become a problem.

In the related art, a heat sink is attached to the periphery of a semiconductor element in some cases for the purpose of heat dissipation of heat generated from the semiconductor element.

As a bonding material with excellent thermal conductivity, for example, Patent Document 1 discloses a paste-like metal fine particle composition in which specific heat-sinterable metal particles, a specific polymer dispersant, and a specific volatile dispersion medium are mixed. It is considered that a solid metal with excellent thermal conductivity is obtained in a case where the composition is sintered.

CITATION LIST

Patent Literature

[Patent Document 1] Japanese Unexamined Patent Application, First Publication No. 2014-111800

DISCLOSURE OF INVENTION

Technical Problem

However, in a case where a fired material is in the form of paste as described in Patent Document 1, the thickness of the paste to be applied is unlikely to be uniform, and the thickness stability tends to be poor.

The present invention has been made in consideration of the above-described circumstances, and an object thereof is to provide a film-shaped fired material which has excellent thickness stability and thermal conductivity and exhibits excellent shear adhesive strength after being fired. Further, another object thereof is to provide a film-shaped fired material with a support sheet which includes the film-shaped fired material.

Solution to Problem

In the related art, it is considered that a material other than metal particles contained in a fired material is excellent as the heat decomposition temperature becomes lower. However, the present inventors found that, by examining a sintering mechanism from the thermophysical viewpoint, a film-shaped fired material having a specific relationship between a thermogravimetric curve (TG curve) and a differential thermal analysis curve (DTA curve) has excellent thickness stability and thermal conductivity and is capable of exhibiting excellent shear adhesive strength after being fired, thereby completing the present invention.

In other words, the present invention includes the following aspects.

[1] A film-shaped fired material, including: sinterable metal particles; and a binder component, in which a time (A1) after the start of a temperature increase, at which a negative gradient is the highest, in a thermogravimetric curve (TG curve) measured from 40° C. to 600° C. at a temperature-rising-rate of 10° C./min in an air atmosphere and a maximum peak time (B1) in a time range of 0 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample satisfy a relationship of "A1<B1<A1+200 seconds" and a relationship of "A1<2000 seconds".

[2] The film-shaped fired material according to [1], in which a time (A1') after the start of a temperature increase, at which a negative gradient is the highest, in a thermogravimetric curve (TG curve) measured from 40° C. to 600° C. at a temperature-rising-rate of 10° C./min in an air atmosphere with respect to a component obtained by removing the sinterable metal particles from the film-shaped fired material and a peak time (B1') observed in a shortest time among peaks observed in a time range of 960 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample with respect to the sinterable metal particles satisfy a relationship of B1'<A1'.

[3] The film-shaped fired material according to [1] or [2], in which an endothermic peak is not present in a time range of 0 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample with respect to the film-shaped fired material.

[4] A film-shaped fired material, including: sinterable metal particles; and a binder component, in which a temperature (A2), at which a negative gradient is the highest, in a thermogravimetric curve (TG curve) measured at a temperature-rising-rate of 10° C./min in a nitrogen atmosphere and a maximum peak temperature (B2) in a temperature range of 25° C. to 400° C. in a differential thermal analysis curve (DTA curve) measured at a temperature-rising-rate of 10° C./min in a nitrogen atmosphere using alumina particles as a reference sample satisfy a relationship of "A2<B2<A2+60° C.".

[5] The film-shaped fired material according to [4], in which a temperature (A2'), at which a negative gradient is the highest, in a thermogravimetric curve (TG curve) measured at a temperature-rising-rate of 10° C./min in a nitrogen atmosphere with respect to a component obtained by removing the sinterable metal particles from the film-shaped fired material and a peak temperature (B2') observed at a lowest temperature among peaks observed in a temperature range of 200° C. to 400° C. in a differential thermal analysis curve (DTA curve) measured at a temperature-rising-rate of 10° C./min in a nitrogen atmosphere using alumina particles as a reference sample with respect to the sinterable metal particles satisfy a relationship of B2'<A2'.

[6] The film-shaped fired material according to [4] or [5], in which an endothermic peak is not present in a temperature range of 25° C. to 400° C. in a differential thermal analysis curve (DTA curve) measured at a temperature-rising-rate of 10° C./min in a nitrogen atmosphere using alumina particles as a reference sample with respect to the film-shaped fired material.

[7] The film-shaped fired material according to any one of [1] to [6], in which the sinterable metal particles are silver nanoparticles.

[8] A film-shaped fired material with a support sheet, including: the film-shaped fired material according to any one of [1] to [7]; and a support sheet provided on at least one side of the film-shaped fired material.

[9] The film-shaped fired material with a support sheet according to [8], in which the support sheet is provided with a pressure-sensitive adhesive layer on a base film, and the film-shaped fired material is provided on the pressure-sensitive adhesive layer.

Advantageous Effects of Invention

According to the present invention, it is possible to provide a film-shaped fired material which has excellent thickness stability and thermal conductivity and exhibits excellent shear adhesive strength after being fired. Further, it is possible to provide a film-shaped fired material with a support sheet which includes the film-shaped fired material and is used for sinter bonding of a semiconductor element.

BEST MODE FOR CARRYING OUT THE INVENTION

Hereinafter, embodiments of the present invention will be appropriately described with reference to the accompanying drawings.

Further, the drawings used in the description below are shown by enlarging main portions for convenience in order to facilitate understanding the features of the present invention, and the dimensional ratio and the like of each constituent element are not necessarily the same as the actual ratio and the like.

<<Film-Shaped Fired Material>>

A film-shaped fired material according to a first embodiment is a film-shaped fired material which contains sinterable metal particles and a binder component, in which a time (A1) after the start of a temperature increase, at which a negative gradient is the highest, in a thermogravimetric curve (TG curve) measured from 40° C. to 600° C. at a temperature-rising-rate of 10° C./min in an air atmosphere and a maximum peak time (B1) in a time range of 0 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample satisfy a relationship of "A1<B1<A1+200 seconds" and a relationship of "A1<2000 seconds".

Figure 1:
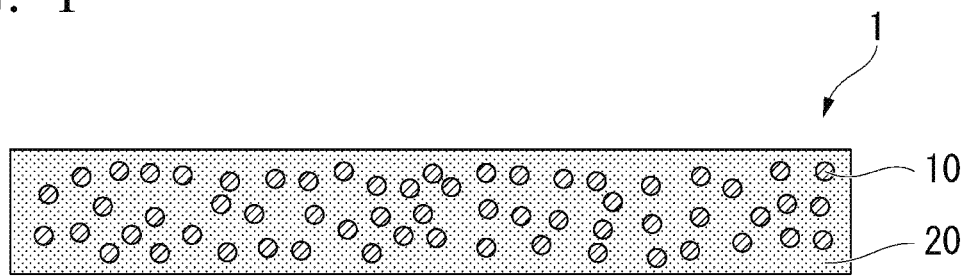
FIG. 1 is a cross-sectional view schematically illustrating a film-shaped fired material according to an embodiment of the present invention.

A film-shaped fired material according to a second embodiment is a film-shaped fired material which contains sinterable metal particles and a binder component, in which a temperature (A2), at which a negative gradient is the highest, in a thermogravimetric curve (TG curve) measured at a temperature-rising-rate of 10° C./min in a nitrogen atmosphere and a maximum peak temperature (B2) in a temperature range of 25° C. to 400° C. in a differential thermal analysis curve (DTA curve) measured at a temperature-rising-rate of 10° C./min in a nitrogen atmosphere using alumina particles as a reference sample satisfy a relationship of "A2<B2<A2+60° C.". FIG. 1 is a cross-sectional view schematically illustrating a film-shaped fired material according to the first embodiment and the second embodiment. A film-shaped fired material 1 contains sinterable metal particles 10 and a binder component 20.

The film-shaped fired material may be formed of one layer (single layer) or two or more of a plurality of layers. In a case where the film-shaped fired material is formed of a plurality of layers, the plurality of layers may be the same as or different from one another, and a combination of the plurality of layers is not particularly limited as long as the effects of the present invention are not damaged.

Further, in the present specification, the expression "the plurality of layers may be the same as or different from one another" means that "all layers may be the same as one another, all layers may be different from one another, or only some layers may be the same as one another" and the expression "the plurality of layers are different from one another" means that "at least one of the constituent materials of each layer, the compounding ratios of constituent materials, and the thicknesses of layers are different from one another" without limiting to the case of the film-shaped fired material.

The thickness of the film-shaped fired material before being fired is not particularly limited, but is preferably in a range of 10 to 200 μm, preferably in a range of 20 to 150 μm, and more preferably in a range of 30 to 90 μm.

Here, the "thickness of the film-shaped fired material" indicates the thickness of the entire film-shaped fired material. For example, the thickness of the film-shaped fired material formed of a plurality of layers indicates the total thickness of all layers constituting the film-shaped fired material.

In the present specification, the "thickness" can be acquired using a constant pressure thickness-measuring device in conformity with JIS K7130 as a value obtained by averaging the measured values at optional five sites.

(Release Film)

The film-shaped fired material can be provided in a state of being laminated on a release film. At the time of use, the release film may be peeled off and disposed on an object to which the film-shaped fired material is sinter-bonded. The release film also has a function as a protective film to prevent damage to the film-shaped fired material and adhesion of dirt. The release film may be provided on at least one side of the film-shaped fired material or on both sides of the film-shaped fired material.

Examples of the release film include transparent films such as a polyethylene film, a polypropylene film, a polybutene film, a polybutadiene film, a polymethyl pentene film, a polyvinyl chloride film, a vinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene-(meth)acrylic acid copolymer film, an ethylene-(meth)acrylic acid ester copolymer film, a polystyrene film, a polycarbonate film, a polyimide film, and a fluorine resin film. Further, crosslinked films of these are also used. Further, laminated films of these may also be used. Further, films obtained by coloring these films and opaque films can also be used. Examples of a release agent include a silicone-based release agent, a fluorine-based release agent, an alkyd-based release agent, an olefin-based release agent, a long-chain alkyl group-containing carbamate.

The thickness of the release film is typically in a range of 10 to 500 μm, preferably in a range of 15 to 300 μm, and particularly preferably in a range of 20 to 250 μm.

<Sinterable Metal Particles>

The sinterable metal particles are metal particles which can be fused and bonded to form a sintered body by being subjected to a heat treatment as sintering of the film-shaped fired material. The formation of the sintered body enables sinter bonding of the film-shaped fired material and a fired product in contact with the film-shaped fired material.

Examples of the metal species of the sinterable metal particles include silver, gold, copper, iron, nickel, aluminum, silicon, palladium, platinum, titanium, barium titanate, and oxides or alloys of these. Among these, silver and silver oxide are preferable. Only one kind of metal or a combination of two or more kinds of metals may be blended into the sinterable metal particles.

It is preferable that the sinterable metal particles are silver nanoparticles which are nano-sized silver particles.

The particle diameter of the sinterable metal particles contained in the film-shaped fired material is not particularly limited as long as sinterability can be exhibited, but may be 100 nm or less, 50 nm or less, or 30 nm or less. Further, the particle diameter of the metal particles contained in the film-shaped fired material is set as a projected area circle equivalent diameter of the particle diameter of the metal particles observed using an electron microscope.

The metal particles with the particle diameter in the above-described range are preferable from the viewpoint of excellent sinterability.

In the particle diameter of the sinterable metal particles contained in the film-shaped fired material, the number average of the particle diameters acquired using particles whose projected area circle equivalent diameters of the particle diameters of the metal particles observed using an electron microscope are 100 nm or less may be in a range of 0.1 to 95 nm, in a range of 0.3 to 50 nm, or in a range of 0.5 to 30 nm. Further, the number of metal particles to be measured is set to 100 or more of particles randomly selected per one film-shaped fired material.

Since the sinterable metal particles are set to be in a state in which aggregates are eliminated in advance before binder components and other additive components are mixed with the sinterable metal particles, the sinterable metal particles may be dispersed in a high-boiling point solvent having a high boiling point such as isobornyl hexanol or decyl alcohol. The boiling point of the high-boiling point solvent may be, for example, in a range of 200° C. to 350° C. At this time, in a case where the high-boiling point solvent is used, since the solvent is unlikely to volatilize at room temperature, an increase in concentration of the sinterable metal particles is prevented, the workability is improved, and the re-aggregation and the like of the sinterable metal particles are also prevented so that the quality thereof becomes excellent in some cases.

As the dispersion method, the dispersion may be carried out using a kneader, a triple roll, a bead mill, or ultrasonic waves.

In the present specification, "room temperature" indicates a temperature at which a material is not particularly cooled or heated, that is, a normal temperature, and a temperature range of 15° C. to 25° C. may be exemplified.

Metal particles (sinterable metal particles) having a particle diameter of 100 nm or less and non-sinterable metal particles having a particle diameter of greater than 100 nm that do not correspond to the above-described metal particles may further be blended into the film-shaped fired material according to the embodiment. In the particle diameter of the non-sinterable metal particles having a particle diameter of greater than 100 nm, the number average of the particle diameters acquired using particles whose projected area circle equivalent diameters of the particle diameters of the metal particles observed using an electron microscope are greater than may be greater than 150 nm and 50000 nm or less, in a range of 150 to 10000 nm, or in a range of 180 to 5000 nm.

Examples of the metal species of the non-sinterable metal particles having a particle diameter of greater than 100 nm are the same as those described above. Among these, silver, copper, and oxides of these are preferable.

The metal particles having a particle diameter of 100 nm or less and the non-sinterable metal particles having a particle diameter of greater than 100 nm may be the metal species which are the same as or different from each other. For example, the metal particles having a particle diameter of 100 nm or less may be silver particles and the non-sinterable metal particles having a particle diameter of greater than 100 nm may be silver particles or silver oxide particles. For example, the metal particles having a particle diameter of 100 nm or less may be silver particles or silver oxide particles and the non-sinterable metal particles having a particle diameter of greater than 100 nm may be copper particles or copper oxide particles.

In the film-shaped fired material according to the embodiment, the content of the metal particles having a particle diameter of 100 nm or less may be in a range of 20 to 100 parts by mass, in a range of 30 to 99 parts by mass, or in a range of 50 to 95 parts by mass with respect to 100 parts by mass which is the total mass of all metal particles.

At least one surface of the sinterable metal particle and the non-sinterable metal particle may be coated with an organic substance. In a case where the film-shaped fired material has a film coated with an organic substance, the compatibility with a binder component is improved. Further, aggregation of particles can be prevented, and the particles can be uniformly dispersed.

In a case where at least one surface of the sinterable metal particle and the non-sinterable metal particle may be coated with an organic substance, the mass of the sinterable metal particle and the non-sinterable metal particle is set as a value of the mass including the coated substance.

<Binder Component>

In a case where a binder component is blended into the film-shaped fired material, the fired material can be formed in a film shape, and tackiness can be imparted to the film-shaped fired material before being fired. The binder component may be thermally decomposed by being subjected to a heat treatment as firing of the film-shaped fired material.

The binder component is not particularly limited, and suitable examples of the binder component include resins. Examples of the resins include an acrylic resin, a polycarbonate resin, polylactic acid, and a polymer of a cellulose derivative. Among these, an acrylic resin is preferable. The acrylic resin includes a homopolymer of a (meth)acrylate compound, two or more copolymers of a (meth)acrylate compound, and a copolymer of a (meth)acrylate compound and another copolymer monomer.

The content of the constituent unit derived from the (meth)acrylate compound in the resin constituting the binder component is preferably in a range of 50% to 100% by mass, more preferably in a range of 80% to 100% by mass, and still more preferably in a range of 90% to 100% by mass with respect to the total amount of the constituent units.

Here, the term "derived" means that the monomer has undergone a structural change necessary for polymerization.

Specific examples of the (meth)acrylate compound include alkyl (meth)acrylate such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, pentyl (meth)acrylate, amyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, or isostearyl (meth)acrylate;

hydroxyalkyl (meth)acrylate such as hydroxyethyl (meth)acrylate, 2-hydroxypropyl (meth)acrylate, 4-hydroxybutyl (meth)acrylate, 3-hydroxypropyl (meth)acrylate, 2-hydroxybutyl (meth)acrylate or 3-hydroxybutyl (meth)acrylate; phenoxyalkyl (meth)acrylate such as phenoxyethyl (meth)acrylate, 2-hydroxy-3-phenoxypropyl (meth)acrylate; alkoxyalkyl (meth)acrylate such as 2-methoxyethyl (meth)acrylate, 2-ethoxyethyl (meth)acrylate, 2-propoxyethyl (meth)acrylate, 2-butoxyethyl (meth)acrylate, or 2-methoxybutyl (meth)acrylate; polyalkylene glycol (meth)acrylate such as polyethylene glycol mono(meth)acrylate, ethoxy diethylene glycol (meth)acrylate, methoxy polyethylene glycol (meth)acrylate, phenoxy polyethylene glycol (meth)acrylate, nonyl phenoxy polyethylene glycol (meth)acrylate, polypropylene glycol mono(meth)acrylate, methoxy polypropylene glycol (meth)acrylate, ethoxy polypropylene glycol (meth)acrylate, or nonyl phenoxy polypropylene glycol (meth)acrylate; cycloalkyl (meth)acrylate such as cyclohexyl (meth)acrylate, 4-butyl cyclohexyl (meth)acrylate, dicyclopentanyl (meth)acrylate, dicyclopentenyl (meth)acrylate, dicyclopentadienyl (meth)acrylate, bornyl (meth)acrylate, isobornyl (meth)acrylate, or tricyclodecanyl (meth)acrylate; and benzyl (meth)acrylate, and tetrahydrofurfuryl (meth)acrylate. Among these, alkyl (meth)acrylate or alkoxyalkyl (meth)acrylate is preferable. As a particularly preferable (meth)acrylate compound, butyl (meth)acrylate, ethylhexyl (meth)acrylate, lauryl (meth)acrylate, isodecyl (meth)acrylate, 2-ethylhexyl (meth)acrylate, and 2-ethoxyethyl (meth)acrylate are exemplified.

In the present specification, the concept of "(meth)acrylic acid" includes both of "acrylic acid" and "methacrylic acid", and the concept of "(meth)acrylate" includes both of "acrylate" and "methacrylate".

As an acrylic resin, methacrylate is preferable. In a case where the binder component has a constituent unit derived from methacrylate, a film-shaped fired material, in which the time (A1) and the time (B1) have the relationship of "A1<B1<A1+200 seconds" and the relationship of "A1<2000 seconds", is easily obtained. Further, in a case where the binder component has a constituent unit derived from methacrylate, a film-shaped fired material in which the time (A2) and the temperature (B2) have the relationship of "A2<B2<A2+60° C." is easily obtained.

The content of the constituent unit derived from methacrylate in the resin constituting the binder component is preferably in a range of 50% to 100% by mass, more preferably in a range of 80% to 100% by mass, and still more preferably in a range of 90% to 100% by mass with respect to the total amount of the constituent units.

Another copolymer monomer is not particularly limited as long as the compound can be copolymerized with the (meth)acrylate compound, and examples thereof include unsaturated carboxylic acids such as (meth)acrylic acid, vinyl benzoic acid, maleic acid, and vinyl phthalic acid; and a vinyl group-containing radically polymerizable compound such as vinyl benzyl methyl ether, vinyl glycidyl ether, styrene, α-methylstyrene, butadiene, or isoprene.

The weight-average molecular weight (Mw) of the resin constituting the binder component is preferably in a range of 1000 to 1000000 and more preferably in a range of 10000 to 800000. In a case where the weight-average molecular weight of the resin is in the above-described range, the film exhibits sufficient film hardness, and the flexibility can be easily imparted to the film.

In the present specification, the "weight-average molecular weight" is a value in terms of polystyrene which is measured according to the gel permeation chromatography (GPC) method.

The glass transition temperature (Tg) of the resin constituting the binder component can be acquired using the Fox's theoretical formula, and is preferably in a range of −60° C. to 50° C., more preferably in a range of −30° C. to 10° C., and still more preferably −20° C. or higher and lower than 0° C. In a case where the Tg of the resin acquired using the Fox's formula is lower than or equal to the above-described upper limit, the adhesive strength between the film-shaped fired material and an adherend before firing of the material is improved. Further, in a case where the Tg of the resin acquired using the Fox's formula is higher than or equal to the above-described lower limit, the film shape can be maintained, and the film-shaped fired material is more easily pulled apart from the support sheet or the like.

The Tg of the acrylic polymer shows the following relationship according to the Fox's formula based on the weight ratio of the monomer in each polymer portion.

$$1/Tg = (W1/Tg1) + W2/Tg2) + \ldots + (Wm/Tgm)$$

$$W1 + W2 + \ldots + Wm = 1$$

In the formula, the Tg represents the glass transition temperature of the polymer portion, and Tg1, Tg2, ..., Tgm represent the glass transition temperature of each polymerization monomer. Further, W1, W2, ..., Wm represent the weight ratio of each polymerization monomer.

The glass transition temperature of each polymerization monomer according to the Fox's formula can be acquired using values described in Polymer Data Handbook and Handbook of Pressure-sensitive Adhesion.

The binder component may be thermally decomposed by being subjected to a heat treatment as firing of the film-shaped fired material. The thermal decomposition of the binder component can be confirmed from a decrease in mass of the binder component due to firing. Further, a component to be blended as the binder component may be almost thermally decomposed due to firing, but the entire component to be blended as the binder component may not be thermally decomposed due to firing.

The mass of the binder component after being fired may be 10% by mass or less, 5% by mass or less, or 3% by mass or less with respect to 100% by mass which is the total mass of the binder component before being fired.

In addition to the sinterable metal particles, the non-sinterable metal particles, and the binder component, the film-shaped fired material according to the embodiment may contain other additives that do not correspond to the sinterable metal particles, the non-sinterable metal particles, and the binder component, within a range where the effects of the present invention are not damaged.

Examples of other additives which may be contained in the film-shaped fired material according to the present embodiment include a solvent, a dispersant, a plasticizer, a tackifier, a storage stabilizer, an antifoaming agent, a thermal decomposition accelerator, and an antioxidant. The film-shaped fired material may contain only one or two or more kinds of additives. These additives are not particularly limited and can be appropriately selected from those which have been typically used in this field.

<Composition>

The film-shaped fired material according to the embodiment may be formed of the sinterable metal particles, the binder component, and other additives, and the total content (% by mass) of these may be 100% by mass.

In a case where the film-shaped fired material according to the embodiment contains the non-sinterable metal particles, the film-shaped fired material may be formed of the sinterable metal particles, the non-sinterable metal particles, the binder component, and other additives, and the total content (% by mass) of these may be 100% by mass.

The content of the sinterable metal particles in the film-shaped fired material is preferably in a range of 10% to 98% by mass, more preferably in a range of 15% to 90% by mass, and still more preferably in a range of 20% to 80% by mass with respect to 100% by mass which is the total content of all components other than the solvent (hereinafter, also noted as the "solid content").

In a case where the film-shaped fired material contains the non-sinterable metal particles, the total content of the sinterable metal particles and the non-sinterable metal particles is preferably in a range of 50% to 98% by mass, more preferably in a range of 70% to 95% by mass, and still more preferably in a range of 80% to 90% by mass with respect to 100% by mass which is the total content of the solid content in the film-shaped fired material.

The content of the binder component is preferably in a range of 2% to 50% by mass, more preferably in a range of 5% to 30% by mass, and still more preferably in a range of 10% to 20% by mass with respect to 100% by mass which is the total content of the solid content in the film-shaped fired material.

The mass ratio (sinterable metal particles:binder component) of the sinterable metal particles to the binder component in the film-shaped fired material is preferably in a range of 50:1 to 1:5, more preferably in a range of 20:1 to 1:2, and still more preferably in a range of 10:1 to 1:1. In a case where the film-shaped fired material contains the non-sinterable metal particles, the mass ratio ((sinterable metal particles+non-sinterable metal particles):binder component) of the sinterable metal particles and the non-sinterable metal particles to the binder component is preferably in a range of 50:1 to 1:1, more preferably in a range of 20:1 to 2:1, and still more preferably in a range of 9:1 to 4:1.

[Film-Shaped Fired Material According to First Embodiment]

In a case where the film-shaped fired material according to the first embodiment has the above-described composition, a film-shaped fired material, in which the time (A1) and the time (B1) have a relationship of "A1<B1<A1+200 seconds" and a relationship of "A1<2000 seconds", is easily obtained.

The film-shaped fired material according to the first embodiment may contain a high-boiling point solvent used at the time of mixing the sinterable metal particles, the non-sinterable metal particles, the binder component, and other additive components. The content of the high-boiling point solvent is preferably 20% by mass or less, more preferably 15% by mass or less, and still more preferably 10% by mass or less with respect to 100% by mass which is the total mass of the film-shaped fired material according to the first embodiment. In a case where the content of the high-boiling point solvent is less than or equal to the above-described upper limit, a film-shaped fired material, in which the time (A1) and the time (B1) have the relationship of "A1<B1<A1+200 seconds" and the relationship of "A1<2000 seconds", is easily obtained. Further, a film-shaped fired material in which an endothermic peak is not present in a time range of 0 seconds to 2160 seconds after the start of a temperature increase in the differential thermal analysis curve (DTA curve) measured in an air atmosphere is easily obtained.

<Time (A1) and Time (B1)>

The film-shaped fired material according to the first embodiment is a film-shaped fired material in which the time (A1) after the start of a temperature increase, at which a negative gradient is the highest, in the thermogravimetric curve (TG curve) measured from 40° C. to 600° C. at a temperature-rising-rate of 10° C./min in an air atmosphere and the maximum peak time (B1) in a time range of 0 seconds to 2160 seconds after the start of a temperature increase in the differential thermal analysis curve (DTA curve) measured from 40° C. to 600° C. at a temperature-rising-rate of 10° C./min in an air atmosphere using alumina particles as a reference sample satisfy the relationship of "A1<B1<A1+200 seconds" and the relationship of "A1<2000 seconds".

The TG curve shows a weight change in the film-shaped fired material during the process of applying a heat treatment to the film-shaped fired material in an air atmosphere.

The DTA curve shows a differential thermal change in the film-shaped fired material during the process of applying a heat treatment to the film-shaped fired material in an air atmosphere.

Hereinafter, the appearance of the film-shaped fired material during the firing process to be assumed from the TG curve and the DTA curve measured in an air atmosphere will be described with reference to the accompanying drawings.

Figure 2:
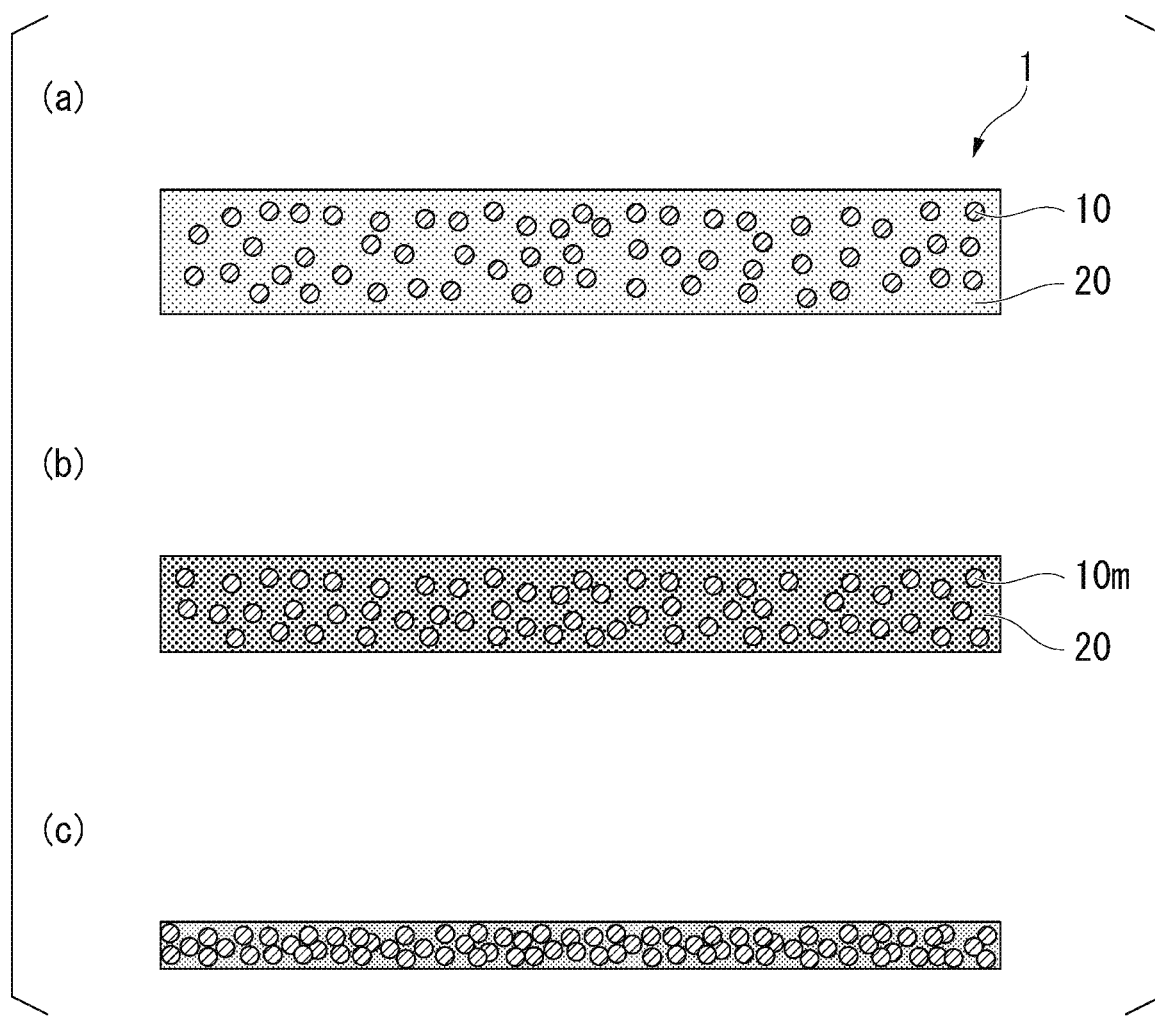
FIG. 2 shows cross-sectional views schematically illustrating the assumed appearance before and after firing of the film-shaped fired material according to the embodiment of the present invention.

FIG. 2 shows cross-sectional views schematically illustrating the assumed appearance before (FIG. 2(a)), during (FIG. 2(b)), and after firing (FIG. 2(c)) of the film-shaped fired material 1 which satisfies the relationship of "A1<B1<A1+200 seconds" and the relationship of "A1<2000 seconds".

In the binder component 20 contained in the film-shaped fired material (FIG. 2(a)) before being fired, the weight thereof decreases (FIGS. 2(b) and (c)) due to heating, and this phenomenon is shown as a negative gradient in the TG curve.

The binder component 20 contained in the film-shaped fired material (FIG. 2(a)) before being fired is thermally decomposed due to heat absorption at the time of being heated, and the sinterable metal particles 10 contained in the film-shaped fired material (FIG. 2(a)) before being fired are melted (FIG. 2(b)) due to heat absorption at the time of being heated and sintered (FIG. 2(c)) during heat generation after being melted. This heat absorption process and heat generation process are observed as the DTA curve. In a case where the sintering process sufficiently advances, the amount of heat to be generated is large and greatly exceeds the amount of heat absorption due to thermal decomposition of the binder component 20 contained in the film-shaped fired material (FIG. 2(a)) and melting of the sinterable metal particles 10. That is, only positive differential heat due to heat generation is observed on the DTA curve obtained from the measurement and is shown as a peak.

It is considered that the expression "the time (A1) and the time (B1) satisfy the relationship of "A1<B1<A1+200 seconds" and the relationship of "A1<2000" means that melting and sintering of the sinterable metal particles are completed during the heating time immediately after the decrease in the amount of the binder component. It has generally been known that the firing temperature is related to the size of the metal particles, and the firing temperature decreases as the size of the metal particles decreases. Therefore, aggregation or fusion of the sinterable metal particles is not confirmed at the start of the sintering in the film-shaped fired material 1 which satisfies the relationships of "A1<B1<A1+200 seconds" and "A1<2000 seconds", and it is assumed that the sinterable metal particles 10 which have been melted in the form of fine particles are sintered.

Figure 3:
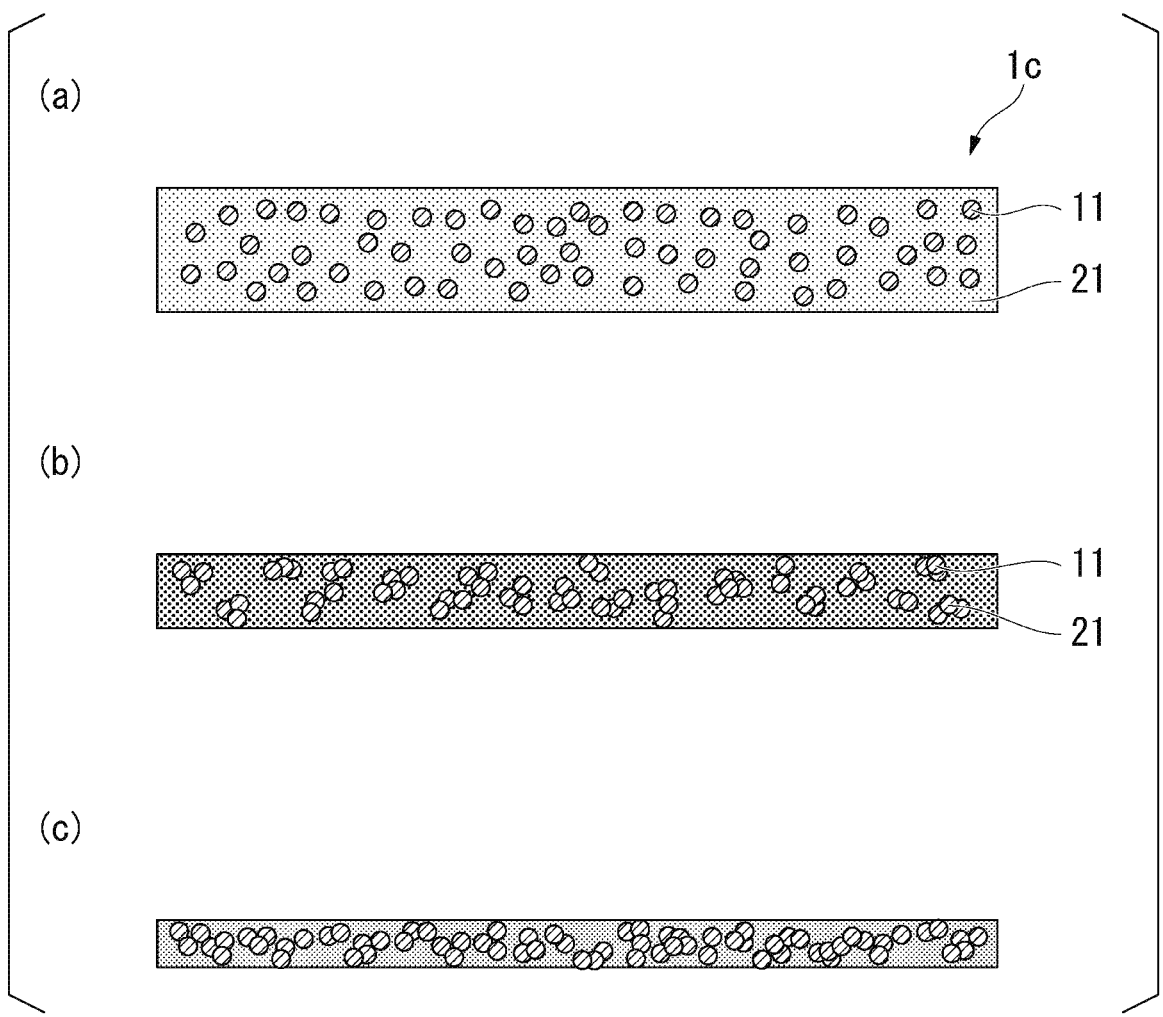
FIG. 3 shows cross-sectional views schematically illustrating the assumed appearance before and after firing of another fired material.

FIG. 3 shows cross-sectional views schematically illustrating the assumed appearance before (FIG. 3(a)), during (FIG. 3(b)), and after firing (FIG. 3(c)) of a fired material 1c which does not satisfy the relationship of "A1<B1<A1+200 seconds" and in which the time B1 is longer than A1+200 seconds. In a binder component 21 contained in the film-shaped fired material (FIG. 3(a)) before being fired, the weight thereof decreases (FIGS. 3(b) and (c)) due to heating, and this phenomenon is shown as a negative gradient in the TG curve.

The binder component 21 contained in the film-shaped fired material (FIG. 3(a)) before being fired is thermally decomposed due to heat absorption at the time of being heated, and sinterable metal particles 11 contained in the film-shaped fired material (FIG. 3(a)) before being fired are melted due to heat absorption and sintered (FIG. 3(c)) due to heat generation. The heat absorption process and the heat generation process of the sinterable metal particles 11 are carried out almost at the same time because the binder component 21 is already absent or only a small amount of the binder component is present. However, since the amount of heat to be generated due to sintering is large, only a positive peak showing the heat generation process is shown on the DTA curve.

It is considered that the expression "the time (A1) and the time (B1) do not satisfy the relationship of "A1<B1<A1+200 seconds" means that firing of the sinterable metal particles is not completed during the heating time immediately after the decrease in the amount of the binder component. The firing temperature is related to the size of the metal particles, and the firing temperature increases as the size of the metal particles increases. That is, for example, it is assumed that the size of the sinterable metal particles is large at the stage of sintering, in the fired material 1c which does not satisfy the relationship of "A1<B1<A1+200 seconds" and in which the time B1 is longer than A1+200 seconds. The reason for this is assumed that the sinterable metal particles 11 form a certain size of a lump and the metal particles in the lump shape are sintered because the decrease in the amount of the binder component due to heating advances before the peak of melting and sintering of the sinterable metal particles, and this results in an increase in the time (B1).

Further, the present inventors found that the film-shaped fired material in which the time (A1) and the time (B1) satisfy the relationship of "A1<B1<A1+200 seconds" and the relationship of "A1<2000 seconds" has excellent shear adhesive strength after being fired.

In the fired material which does not satisfy the relationship of "A1<B1<A1+200 seconds" and in which the time B1 is longer than A1+200 seconds, in a case where the sinterable metal particles in the lump shape are sintered, many sites where sintering has not been sufficient or sintering has not been made remain. Thus, the sintered material is considered to have degraded adhesive strength (shear adhesive strength). Further, the adhesive strength is considered to be degraded due to generation of gaps at the adhesive interface with the adherend and a decrease in the adhesive area.

Further, even if the film-shaped fired material which satisfies the relationship of "A1<B1<A1+200 seconds", in a case where the film-shaped fired material which has the relationship of "A1≥2000 seconds", it is considered that devices members are adversely affected due to degradation of the productivity caused by the extended tact time and an increase in the temperature required for firing.

On the contrary, in the film-shaped fired material which satisfies the relationship of "A1<B1<A1+200 seconds" and the relationship of "A1<2000 seconds", it is considered that the sinterable metals are uniformly and closely metal-bonded due to sintering of the sinterable metal particles which are melted in the form of the fine particles in a state in which the binder component is present, and this results in improvement of the adhesive strength of the sintered material.

The shear adhesive strength after the film-shaped fired material is fired can be measured according to the method described in examples.

In the film-shaped fired material according to the first embodiment, the time (A1) and the time (B1) satisfy the relationship of "A1<B1<A1+200 seconds". For example, the time (A1) and the time (B1) may satisfy a relationship of "A1<B1<A1+100 seconds", a relationship of "A1<B1<A1+60 seconds", or a relationship of "A1<B1<A1+30 seconds".

The maximum peak time (B1) in a time range of 0 seconds to 2160 seconds after the start of a temperature increase is preferably a maximum peak time in a time range of 960 second to 2160 seconds after the start of a temperature increase, more preferably a maximum peak time in a time range of 1080 second to 2100 seconds after the start of a temperature increase, and still more preferably a maximum peak time in a time range of 1260 second to 2040 seconds after the start of a temperature increase, in the differential thermal analysis curve (DTA curve) measured from 40° C. to 600° C. at a temperature-rising-rate of 10° C./min in an air atmosphere using alumina particles as a reference sample.

<Time (A1') and Time (B1')>

It is preferable that the film-shaped fired material according to the first embodiment is a film-shaped fired material in which a time (A1') after the start of a temperature increase, at which a negative gradient is the highest, in the thermogravimetric curve (TG curve) measured from 40° C. to 600° C. at a temperature-rising-rate of 10° C./min in an air atmosphere with respect to the component obtained by removing the sinterable metal particles from the film-shaped fired material and a maximum peak time (B1') observed in a shortest time among peaks observed in a time range of 960 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample with respect to the sinterable metal particles satisfy the relationship of B1'<A1'.

The TG curve shows a weight change in a component obtained by removing the sinterable metal particles from the film-shaped fired material during the process of applying a heat treatment as sintering in an air atmosphere.

The DTA curve shows a differential thermal change in the sinterable metal particles during the process of applying a heat treatment as firing in an air atmosphere.

It is preferable that the film-shaped fired material according to the first embodiment in a case where the film-shaped fired material according to the first embodiment contains non-sinterable metal particles is a film-shaped fired material in which a time (A1') after the start of a temperature increase, at which a negative gradient is the highest, in the thermogravimetric curve (TG curve) measured from 40° C. to 600° C. at a temperature-rising-rate of 10° C./min in an air atmosphere with respect to the component obtained by removing the sinterable metal particles and the non-sinterable metal particles from the film-shaped fired material and a maximum peak time (B1') observed in a shortest time among peaks observed in a time range of 960 seconds to 2160 seconds after the start of a temperature increase in the differential thermal analysis curve (DTA curve) measured from 40° C. to 600° C. at a temperature-rising-rate of 10° C./min in an air atmosphere using alumina particles as a reference sample with respect to the sinterable metal particles and the non-sinterable metal particles satisfy the relationship of B1'<A1'.

In the component obtained by removing the sinterable metal particles and the non-sinterable metal particles from the film-shaped fired material containing the binder component which is contained in the film-shaped fired material before being fired, the weight thereof decreases due to heating in an air atmosphere, and this phenomenon is shown as a negative gradient in the TG curve.

In the sinterable metal particles contained in the film-shaped fired material before being fired, melting and sintering occur due to heating in an air atmosphere, and the melting phenomenon is shown as a negative peak in the DTA curve and the sintering phenomenon is shown as a positive peak in the DTA curve.

The expression "the time (A1') and the time (B1') satisfy the relationship of B1'<A1'" is considered to indicate that melting and sintering of the sinterable metal particles are started earlier than the timing of the decrease in weight of the components distributed in the periphery of the sinterable metal particles of the film-shaped fired material during the process of carrying out the heat treatment. Therefore, the film-shaped fired material that satisfies the relationship of B1'<A1' enters in a state in which the sinterable metal particles are isolated due to the components distributed in the periphery of the sinterable metal particles. Accordingly, the film-shaped fired material is easily melted in the form of the fine particles, the collision frequency drastically increases at the time of reaching the time (A1'), and the sinterable metal particles melted in the form of the fine particles are easily sintered. As a result, the sinterable metals are uniformly and closely metal-bonded in the film-shaped fired material that satisfies the relationship of B1'<A1', and this results in improvement of the strength of the sintered material.

The time (A1') and the time (B1') can be acquired by separating the sinterable metal particles and components obtained by removing the sinterable metal particles from the film-shaped fired material before being fired based on the TG curve and the DTA curve of each of the separated samples.

The sinterable metal particles from the film-shaped fired material before being fired and remaining components obtained by removing the sinterable metal particles can be separated according to the following method.

First, the film-shaped fired material before being fired and a sufficient amount of an organic solvent are mixed, and the solution is allowed to stand for a sufficient time until the sinterable metal particles are precipitated. The components obtained by removing the sinterable metal particles from the film-shaped fired material can be batched off by eliminating the supernatant using a syringe and recovering residues after being dried at 120° C. for 10 minutes. A sufficient amount of an organic solvent is mixed into the liquid containing the sinterable metal particles after the supernatant has been eliminated using a syringe or the like, the solution is allowed to stand for a sufficient time until the sinterable metal particles are precipitated, and the supernatant is eliminated using a syringe or the like.

The sinterable metal particles can be batched off by repeating the process of mixing of the organic solvent, allowing the solution to stand, and eliminating the supernatant five or more times and recovering residues obtained by drying the remaining solution at 120° C. for 10 minutes.

The same applies to the case where the film-shaped fired material according to the first embodiment contains the non-sinterable metal particles, and the time (A1') and the time (B1') can be acquired by separating the sinterable metal particles and the non-sinterable metal particles, and components obtained by removing the sinterable metal particles and the non-sinterable metal particles from the film-shaped fired material before being fired based on the TG curve and the DTA curve of each of the separated samples.

The sinterable metal particles and the non-sinterable metal particles, and components obtained by removing the sinterable metal particles and the non-sinterable metal particles from the film-shaped fired material before being fired can be separated according to the following method.

First, the film-shaped fired material before being fired and a sufficient amount of an organic solvent are mixed, and the solution is allowed to stand for a sufficient time until the sinterable metal particles and the non-sinterable metal particles are precipitated. The components obtained by removing the sinterable metal particles and the non-sinterable metal particles from the film-shaped fired material can be batched off by eliminating the supernatant using a syringe and recovering residues after being dried at 120° C. for 10 minutes. A sufficient amount of an organic solvent is mixed into the liquid containing the sinterable metal particles and the non-sinterable metal particles after the supernatant has been eliminated using a syringe or the like, the solution is allowed to stand for a sufficient time until the sinterable metal particles and the non-sinterable metal particles are precipitated, and the supernatant is eliminated using a syringe or the like.

The sinterable metal particles and the non-sinterable metal particles can be batched off by repeating the process of mixing of the organic solvent, allowing the solution to stand, and eliminating the supernatant five or more times and recovering residues obtained by drying the remaining solution at 120° C. for 10 minutes.

As the solvent to be used here, a solvent which can dissolve the binder component and volatilize under a drying condition of 120° C. to 250° C. for 10 minutes is preferable, and a preferable solvent can be appropriately used depending on the kind or the like of the binder component. Examples thereof include a hydrocarbon such as toluene or xylene; an alcohol such as methanol, ethanol, 2-propanol, isobutyl alcohol (2-methylpropane-1-ol), or 1-butanol; an ester such as ethyl acetate; a ketone such as acetone or methyl ethyl ketone; an ether such as tetrahydrofuran; and an amide (a compound having an amide bond) such as dimethylformamide or N-methylpyrrolidone.

<Endothermic Peak>

It is preferable that the film-shaped fired material according to the first embodiment does not have an endothermic peak in a time range of 0 seconds to 2160 seconds after the start of a temperature increase in the differential thermal analysis curve (DTA curve) measured from 40° C. to 600° C. at a temperature-rising-rate of 10° C./min in an air atmosphere using alumina particles as a reference sample with respect to the film-shaped fired material.

The DTA curve shows a differential thermal change in the film-shaped fired material during the process of applying a heat treatment to the film-shaped fired material as firing.

In a case where an endothermic peak is confirmed on the DTA curve, the film-shaped fired material is considered to contain a component having a property of absorbing heat from the film-shaped fired material and occurs a change (for example, evaporation) in a time range of 0 seconds to 2160 seconds after the start of a temperature increase. That is, it is considered that the occurrence of evaporation of the component leads to the necessity of heat of vaporization accompanied by the evaporation. Further, the film-shaped fired material contains a large amount of components that absorb heat and are thermally decomposed, and thus the amount of heat to be needed for the heat absorption exceeds the amount of heat to be generated by sintering.

Accordingly, it is preferable that the content of the component having a property of evaporating from the film-shaped fired material in a time range of 0 seconds to 2160 seconds after the start of a temperature increase is small or zero in the film-shaped fired material according to the first embodiment. Further, it is preferable that the content of the component that absorbs a large amount of heat during thermal decomposition and disturbs the heat generation process due to sintering is small or the component is not included in the film-shaped fired material.

Here, it is recommended that a pre-treatment such as drying or the like of the film-shaped fired material is performed before the measurement of the DTA curve on the film-shaped fired material so that the moisture absorbed as an impurity is not measured. For example, the drying treatment is carried out at 110° C. for 4 minutes.

Since an endothermic peak is not present in a time range from 0 seconds to 2160 seconds after the start of a temperature increase in the DTA curve, there is no concern of a decrease in the amount of components distributed in the periphery of the sinterable metal particles, and the particles tend to be in a state of being isolated by the components distributed in the periphery of the sinterable metal particles. As a result, in the film-shaped fired material that does not have an endothermic peak in a time range from 0 seconds to 2160 seconds after the start of a temperature increase in the DTA curve, the sinterable metals uniformly and closely form a metal bond. Therefore, the strength of the sintered material tends to be improved. Further, the loss of energy required for firing is reduced to realize the firing in a favorable environment. In this manner, the shear adhesive strength after the film-shaped fired material is fired is considered to be improved.

According to the film-shaped fired material of the first embodiment, the thickness stability is excellent because the material is in the form of a film. Further, since the film-shaped fired material according to the first embodiment contains sinterable metal particles, the thermal conductivity is excellent. Further, the film-shaped fired material according to the first embodiment exhibits excellent shear adhesive strength after firing by satisfying the relationship of "A1<B1<A1+200 seconds" and the relationship of "A1<2000 seconds".

[Film-Shaped Fired Material According to Second Embodiment]

In a case where the film-shaped fired material according to the second embodiment has the above-described composition, a film-shaped fired material in which the temperature (A2) and the temperature (B2) has a relationship of "A2<B2<A2+60° C." is easily obtained.

The film-shaped fired material according to the second embodiment may contain a high-boiling point solvent used at the time of mixing the sinterable metal particles, the non-sinterable metal particles, the binder component, and other additive components. The content of the high-boiling point solvent is preferably 20% by mass or less, more preferably 15% by mass or less, and still more preferably 10% by mass or less with respect to 100% by mass which is the total mass of the film-shaped fired material according to the second embodiment. In a case where the content of the high-boiling point solvent is less than or equal to the above-described upper limit, a film-shaped fired material in which the temperature (A2) and the temperature (B2) has a relationship of "A2<B2<A2+60° C." is easily obtained. Further, a film-shaped fired material in which an endothermic peak is not present in a temperature range of 25° C. to 400° C. in the differential thermal analysis curve (DTA curve) measured in a nitrogen atmosphere is easily obtained.

<Temperature (A2) and Temperature (B2)>

The film-shaped fired material according to the second embodiment is a film-shaped fired material in which the temperature (A2) at which a negative gradient is the highest in the thermogravimetric curve (TG curve) measured at a temperature-rising-rate of 10° C./min in a nitrogen atmosphere and the maximum peak temperature (B2) in a temperature range of 25° C. to 400° C. in the differential thermal analysis curve (DTA curve) measured at a temperature-rising-rate of 10° C./min in a nitrogen atmosphere using alumina particles as a reference sample satisfy the relationship of "A2<B2<A2+60° C.".

The TG curve shows a weight change in the film-shaped fired material during the process of applying a heat treatment to the film-shaped fired material in a nitrogen atmosphere.

The DTA curve shows a differential thermal change in the film-shaped fired material during the process of applying a heat treatment to the film-shaped fired material in a nitrogen atmosphere.

Hereinafter, the appearance of the film-shaped fired material during the firing process to be assumed from the TG curve and the DTA curve measured in a nitrogen atmosphere will be described with reference to the accompanying drawings.

FIG. 2 shows cross-sectional views schematically illustrating the assumed appearance before (FIG. 2(a)), during (FIG. 2(b)), and after firing (FIG. 2(c)) of the film-shaped fired material 1 which satisfies the relationship of "A2<B2<A2+60° C.".

In the binder component 20 contained in the film-shaped fired material (FIG. 2(a)) before being fired, the weight thereof decreases (FIGS. 2(b) and (c)) due to heating, and this phenomenon is shown as a negative gradient in the TG curve.

The binder component 20 contained in the film-shaped fired material (FIG. 2(a)) before being fired is thermally decomposed due to heat absorption at the time of being heated, and the sinterable metal particles 10 contained in the film-shaped fired material (FIG. 2(a)) before being fired are melted (FIG. 2(b)) due to heat absorption at the time of being heated and sintered (FIG. 2(c)) during heat generation after being melted. This heat absorption and heat generation process are observed as the DTA curve. In a case where the sintering process sufficiently advances, the amount of heat to be generated is large and greatly exceeds the amount of heat absorption due to thermal decomposition of the binder component 20 contained in the film-shaped fired material (FIG. 2(a)) and melting of the sinterable metal particles 10. That is, only positive differential heat due to heat generation is observed on the DTA curve obtained from the measurement and is shown as a peak.

It is considered that the expression "the temperature (A2) and the temperature (B2) satisfies the relationship of A2<B2<A2+60° C." means that melting and sintering of the sinterable metal particles are completed at the heating temperature immediately after the decrease in the amount of the binder component. It has generally been known that the firing temperature is related to the size of the metal particles, and the firing temperature decreases as the size of the metal particles decreases. Therefore, aggregation or fusion of the sinterable metal particles is not confirmed at the start of the sintering in the film-shaped fired material 1 which satisfies the relationship of "A2<B2<A2+60° C.", and it is assumed that the sinterable metal particles having a diameter of 10 which have been melted in the form of fine particles are sintered.

FIG. 3 shows cross-sectional views schematically illustrating the assumed appearance before (FIG. 3(a)), during (FIG. 3(b)), and after firing (FIG. 3(c)) of a fired material 1c which does not satisfy the relationship of "A2<B2<A2+60° C." and in which the temperature B2 is higher than A2+60° C. In a binder component 21 contained in the film-shaped fired material (FIG. 3(a)) before being fired, the weight thereof decreases (FIGS. 3(b) and (c)) due to heating, and this phenomenon is shown as a negative gradient in the TG curve.

The binder component 21 contained in the film-shaped fired material (FIG. 3(a)) before being fired is thermally decomposed due to heat absorption at the time of being heated, and sinterable metal particles 11 contained in the film-shaped fired material (FIG. 3(a)) before being fired are melted due to heat absorption and sintered (FIG. 3(c)) due to heat generation. The heat absorption process and the heat generation process of the sinterable metal particles 11 are carried out almost at the same time because the binder component 21 is already absent or only a small amount of the binder component is present. However, since the amount of heat to be generated due to sintering is large, only a positive peak showing the heat generation process is shown on the DTA curve.

It is considered that the expression "the temperature (A2) and the temperature (B2) does not satisfy the relationship of A2<B2<A2+60° C." means that firing of the sinterable metal particles is not completed at the heating temperature immediately after the decrease in the amount of the binder component. The firing temperature is related to the size of the metal particles, and the firing temperature increases as the size of the metal particles increases. That is, for example, it is assumed that the size of the sinterable metal particles is large at the stage of sintering, in the fired material 1c which does not satisfy the relationship of "A2<B2<A2+60° C." and in which the temperature B2 is higher than A2+60° C. The reason for this is assumed that the sinterable metal particles 11 form a certain size of a lump at the stage of the start of sintering and the metal particles in the lump shape are sintered because the decrease in the amount of the binder component due to heating advances before the peak of melting and sintering of the sinterable metal particles, and this results in an increase in the temperature (B2).

Further, the present inventors found that the film-shaped fired material in which the temperature (A2) and the temperature (B2) satisfy the relationship of "A2<B2<A2+60° C." has excellent shear adhesive strength after being fired.

In the fired material which does not satisfy the relationship of "A2<B2<A2+60° C." and in which the temperature B2 is higher than A2+60° C., in a case where the sinterable metal particles in the lump shape are sintered, many sites where sintering has not been sufficient or sintering has not been made remain. Thus, the sintered material is considered to have degraded adhesive strength (shear adhesive strength). Further, the adhesive strength is considered to be degraded due to generation of gaps at the adhesive interface with the adherend and a decrease in the adhesive area.

On the contrary, in the film-shaped fired material which satisfies the relationship of "A2<B2<A2+60° C.", it is considered that the sinterable metal particles are uniformly and closely metal-bonded due to sintering of the sinterable metal particles which are melted in the form of the fine particles, and this results in improvement of the adhesive strength of the sintered material.

The shear adhesive strength after the film-shaped fired material is fired can be measured according to the method described in examples.

In the film-shaped fired material according to the second embodiment, the temperature (A2) and the temperature (B2) satisfy the relationship of "A2<B2<A2+60° C.". For example, the temperature (A2) and the temperature (B2) may satisfy a relationship of "A2<B2<A2+50° C.", a relationship of "A2<B2<A2+40° C.", or a relationship of "A2<B2<A2+30° C.".

The maximum peak temperature (B2) in a temperature range of 25° C. to 400° C. is preferably a maximum peak temperature in a temperature range of 200° C. to 400° C., more preferably a maximum peak temperature in a temperature range of 220° C. to 390° C., and still more preferably a maximum peak temperature in a temperature range of 250° C. to 380° C. in the differential thermal analysis curve (DTA curve) measured at a temperature-rising-rate of 10° C./min in a nitrogen atmosphere using alumina particles as a reference sample.

<Temperature (A2') and Temperature (B2')>

It is preferable that the film-shaped fired material according to the second embodiment is a film-shaped fired material in which a temperature (A2') at which a negative gradient is the highest in the thermogravimetric curve (TG curve) measured at a temperature-rising-rate of 10° C./min in a nitrogen atmosphere with respect to the component obtained by removing the sinterable metal particles from the film-shaped fired material and a peak temperature (B2') observed at a lowest temperature among peaks observed in a temperature range of 200° C. to 400° C. in the differential thermal analysis curve (DTA curve) measured at a temperature-rising-rate of 10° C./min in a nitrogen atmosphere using alumina particles as a reference sample with respect to the sinterable metal particles satisfy a relationship of B2'<A2'.

The TG curve shows a weight change in a component obtained by removing the sinterable metal particles from the film-shaped fired material during the process of applying a heat treatment as firing in a nitrogen atmosphere.

The DTA curve shows a differential thermal temperature change in the sinterable metal particles during the process of applying a heat treatment as firing in a nitrogen atmosphere.

It is preferable that the film-shaped fired material according to the second embodiment, in a case where the film-shaped fired material according to the second embodiment contains the non-sinterable metal particles, is a film-shaped fired material in which the temperature (A2') at which a negative gradient is the highest in the thermogravimetric curve (TG curve) measured at a temperature-rising-rate of 10° C./min in a nitrogen atmosphere with respect to the component obtained by removing the sinterable metal particles and the non-sinterable metal particles from the film-shaped fired material and the peak temperature (B2') observed at a lowest temperature among peaks observed in a temperature range of 200° C. to 400° C. in the differential thermal analysis curve (DTA curve) measured at a temperature-rising-rate of 10° C./min in a nitrogen atmosphere using alumina particles as a reference sample with respect to the sinterable metal particles and the non-sinterable metal particles satisfy a relationship of B2'<A2'.

In the component obtained by removing the sinterable metal particles and the non-sinterable metal particles from the film-shaped fired material containing the binder component which is contained in the film-shaped fired material before being fired, the weight thereof decreases due to heating in a nitrogen atmosphere, and this phenomenon is shown as a negative gradient in the TG curve.

In the sinterable metal particles contained in the film-shaped fired material before being fired, melting and sintering occur due to heating in a nitrogen atmosphere, and the melting phenomenon is shown as a negative peak in the DTA curve and the sintering phenomenon is shown as a positive peak in the DTA curve.

The expression "the temperature (A2') and the temperature (B2') satisfy the relationship of B2'<A2'" is considered to indicate that melting and sintering of the sinterable metal particles are started earlier than the timing of the decrease in weight of the components distributed in the periphery of the sinterable metal particles of the film-shaped fired material during the process of carrying out the heat treatment. Therefore, the film-shaped fired material that satisfies the relationship of B2'<A2' enters in a state in which the sinterable metal particles are isolated due to the components distributed in the periphery of the sinterable metal particles. Accordingly, the film-shaped fired material is easily melted in the form of the fine particles, the collision frequency drastically increases at the time of reaching the temperature (A2'), and the sinterable metal particles melted in the form of the fine particles are easily sintered. As a result, the sinterable metal particles are uniformly and closely metal-bonded in the film-shaped fired material that satisfies the relationship of B2'<A2', and this results in improvement of the strength of the sintered material.

The temperature (A2') and the temperature (B2') can be acquired by separating the sinterable metal particles and components obtained by removing the sinterable metal particles from the film-shaped fired material before being fired based on the TG curve and the DTA curve of each of the separated samples.

The sinterable metal particles from the film-shaped fired material before being fired and remaining components obtained by removing the sinterable metal particles can be separated according to the following method.

First, the film-shaped fired material before being fired and a sufficient amount of an organic solvent are mixed, and the solution is allowed to stand for a sufficient time until the sinterable metal particles are precipitated. The components obtained by removing the sinterable metal particles from the film-shaped fired material can be batched off by eliminating the supernatant using a syringe and recovering residues after being dried at 120° C. for 10 minutes. A sufficient amount of an organic solvent is mixed into the liquid containing the sinterable metal particles after the supernatant has been eliminated using a syringe or the like, the solution is allowed to stand for a sufficient time until the sinterable metal particles are precipitated, and the supernatant is eliminated using a syringe or the like.

The sinterable metal particles can be batched off by repeating the process of mixing of the organic solvent, allowing the solution to stand, and eliminating the supernatant five or more times and recovering residues obtained by drying the remaining solution at 120° C. for 10 minutes.

The same applies to the case where the film-shaped fired material according to the second embodiment contains the non-sinterable metal particles, and the temperature (A2') and the temperature (B2') can be acquired by separating the sinterable metal particles and the non-sinterable metal particles, and components obtained by removing the sinterable metal particles and the non-sinterable metal particles from the film-shaped fired material before being fired based on the TG curve and the DTA curve of each of the separated samples.

The sinterable metal particles and the non-sinterable metal particles, and remaining components obtained by removing the sinterable metal particles and the non-sinterable metal particles from the film-shaped fired material before being fired can be separated according to the following method.

First, the film-shaped fired material before being fired and a sufficient amount of an organic solvent are mixed, and the solution is allowed to stand for a sufficient time until the sinterable metal particles and the non-sinterable metal particles are precipitated. The components obtained by removing the sinterable metal particles and the non-sinterable metal particles from the film-shaped fired material can be batched off by eliminating the supernatant using a syringe and recovering residues after being dried at 120° C. for 10 minutes. A sufficient amount of an organic solvent is mixed into the liquid containing the sinterable metal particles and the non-sinterable metal particles after the supernatant has been eliminated using a syringe or the like, the solution is allowed to stand for a sufficient time until the sinterable metal particles and the non-sinterable metal particles are precipitated, and the supernatant is eliminated using a syringe or the like. The sinterable metal particles and the non-sinterable metal particles can be batched off by repeating the process of mixing of the organic solvent, allowing the solution to stand, and eliminating the supernatant five or more times and recovering residues obtained by drying the remaining solution at 120° C. for 10 minutes.

As the solvent to be used here, a solvent which can dissolve the binder component and volatilize under a drying condition of 120° C. to 250° C. for 10 minutes is preferable, and a preferable solvent can be appropriately used depending on the kind or the like of the binder component. Examples thereof include a hydrocarbon such as toluene or xylene; an alcohol such as methanol, ethanol, 2-propanol, isobutyl alcohol (2-methylpropane-1-ol), or 1-butanol; an ester such as ethyl acetate; a ketone such as acetone or methyl ethyl ketone; an ether such as tetrahydrofuran; and an amide (a compound having an amide bond) such as dimethylformamide or N-methylpyrrolidone.

<Endothermic Peak>

It is preferable that the film-shaped fired material according to the second embodiment does not have an endothermic peak in a temperature range of 25° C. to 400° C. in the differential thermal analysis curve (DTA curve) measured at a temperature-rising-rate of 10° C./min in a nitrogen atmosphere using alumina particles as a reference sample with respect to the film-shaped fired material.

The DTA curve shows a differential thermal temperature change in the film-shaped fired material during the process of applying a heat treatment to the film-shaped fired material as firing.

In a case where an endothermic peak is confirmed on the DTA curve, the film-shaped fired material is considered to contain a component having a property of absorbing heat from the film-shaped fired material in a temperature range of 25° C. to 400° C. and occurs a change (for example, evaporation). That is, it is considered that the occurrence of evaporation of the component leads to the necessity of heat of vaporization accompanied by the evaporation. Further, the film-shaped fired material contains a large amount of components that absorb heat and are thermally decomposed, and thus the amount of heat to be needed for the heat absorption exceeds the amount of heat to be generated by sintering.

Accordingly, it is preferable that the content of the component having a property of evaporating from the film-shaped fired material in a temperature range of 25° C. to 400° C. is small or zero in the film-shaped fired material according to the second embodiment.

Further, it is preferable that the content of the component that absorbs a large amount of heat during thermal decomposition and disturbs the heat generation process due to sintering is small or zero in the film-shaped fired material.

Here, it is recommended that a pre-treatment such as drying or the like of the film-shaped fired material is performed before the measurement of the DTA curve on the film-shaped fired material so that the moisture absorbed as an impurity is not measured. For example, the drying treatment is carried out at 110° C. for 4 minutes.

Since an endothermic peak is not present in a temperature range of 25° C. to 400° C. in the DTA curve, there is no concern of a decrease in the amount of components distributed in the periphery of the sinterable metal particles, and the particles tend to be in a state of being isolated by the components distributed in the periphery of the sinterable metal particles. As a result, in the film-shaped fired material that does not have an endothermic peak in a temperature range of 25° C. to 400° C. in the DTA curve, the sinterable metal particles uniformly and closely form a metal bond. Therefore, the strength of the sintered material tends to be improved. Further, the loss of energy required for firing is reduced to realize the firing in a favorable environment. In this manner, the shear adhesive strength after the film-shaped fired material is fired is considered to be improved.

According to the film-shaped fired material of the second embodiment, the thickness stability is excellent because the material is in the form of a film. Further, since the film-shaped fired material according to the second embodiment contains sinterable metal particles, the thermal conductivity is excellent. Further, the film-shaped fired material according to the second embodiment exhibits excellent shear adhesive strength after firing by satisfying the relationship of "A2<B2<A2+60° C.".

<<Method of Producing Film-Shaped Fired Material>>

The film-shaped fired material can be formed using a fired material composition containing this constituent material.

For example, a film-shaped adhesive can be formed in a target portion by coating a target surface on which the film-shaped fired material is formed with a fired material composition containing a solvent and each component for constituting the film-shaped fired material and drying the composition to volatilize the solvent as necessary.

As the solvent, a solvent having a boiling point of lower than 250° C. is preferable, and a solvent having a boiling point of lower than 200° C. is more preferable. Examples thereof include n-hexane (boiling point: 68° C.), ethyl acetate (boiling point: 77° C.), 2-butanone (boiling point: 80° C.), n-heptane (boiling point: 98° C.), methyl cyclohexane (boiling point: 101° C.), toluene (boiling point: 111° C.), acetyl acetone (boiling point: 138° C.), n-xylene (boiling point: 139° C.), dimethylformamide (boiling point: 153°

C.), and butyl carbitol (boiling point: 230° C.). These solvents may be used alone or in combination.

As the target surface on which the film-shaped fired material is formed, a surface of a release film is exemplified.

The surface thereof may be coated with the fired material composition using a known method, and examples of the method include methods of using various coaters such as an air knife coater, a blade coater, a bar coater, a gravure coater, a Comma (registered trademark) coater, a roll coater, a roll knife coater, a curtain coater, a die coater, a knife coater, a screen coater, a Meyer bar coater, and a kiss coater.

The condition for drying the fired material composition is not particularly limited, but it is preferable that the fired material composition is dried by being heated in a case where the fired material composition contains a solvent. In this case, it is preferable that the fired material composition is dried, for example, in a temperature range of 70° C. to 250° C. or in a temperature range of 80° C. to 180° C. for 10 seconds to 10 minutes.

<<Film-Shaped Fired Material With Support Sheet>>

A film-shaped fired material with a support sheet according to the embodiment includes the film-shaped fired material and a support sheet provided on at least one side of the film-shaped fired material. The support sheet is formed such that a pressure-sensitive adhesive layer is provided on the entire surface or the outer peripheral portion of a base film, and it is preferable that the film-shaped fired material is provided on the pressure-sensitive adhesive layer. The film-shaped fired material may be provided by being brought into direct contact with the pressure-sensitive adhesive layer or provided by being brought into direct contact with the base film. By employing the present form, the material can be used as a dicing sheet used at the time of singulating a semiconductor wafer into an element. Further, by performing singulation together with a wafer using a blade or the like, the film-shaped fired material having the same shape as the shape of the element can be processed, and a semiconductor element provided with the film-shaped fired material can be produced.

Figure 4:
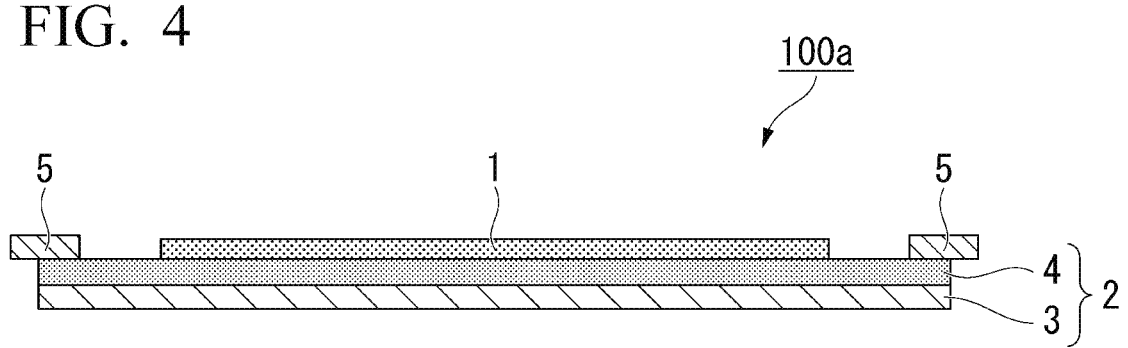
FIG. 4 is a cross-sectional view schematically illustrating a state in which a film-shaped fired material with a support sheet according to an embodiment of the present invention is attached to a ring frame.
Figure 5:
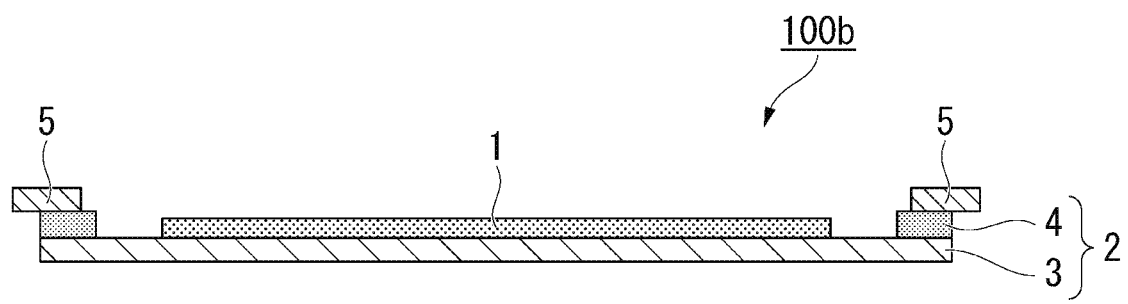
FIG. 5 is a cross-sectional view schematically illustrating a state in which the film-shaped fired material with a support sheet according to an embodiment of the present invention is attached to a ring frame.

Hereinafter, an embodiment of the film-shaped fired material with a support sheet will be described. FIGS. 4 and 5 are cross-sectional views schematically illustrating the film-shaped fired material with a support sheet according to the present embodiment. As illustrated in FIGS. 4 and 5, film-shaped fired materials with a support sheet 100a and 100b according to the present embodiment are formed such that the film-shaped fired material 1 is temporarily and peelably attached to the inner peripheral portion of a support sheet 2 having a pressure-sensitive adhesive portion on the outer peripheral portion. As illustrated in FIG. 4, the support sheet 2 is a pressure-sensitive adhesive sheet having a pressure-sensitive adhesive layer 4 on the upper surface of a base film 3, and the surface of the inner peripheral portion of the pressure-sensitive adhesive layer 4 is covered with the film-shaped fired material to expose the pressure-sensitive adhesive portion to the outer peripheral portion. Further, as illustrated in FIG. 5, the support sheet 2 may include a ring-shaped pressure-sensitive adhesive layer 4 on the outer peripheral portion of the base film 3.

The film-shaped fired material 1 is formed in the substantially the same shape as the shape of a work (a semiconductor wafer or the like) to be attached to the inner peripheral portion of the support sheet 2. The support sheet 2 has a pressure-sensitive adhesive portion on the outer peripheral portion. According to a preferred mode, the film-shaped fired material 1 having a diameter smaller than the diameter of the support sheet 2 is concentrically laminated on the circular support sheet 2. The pressure-sensitive adhesive portion on the outer peripheral portion is used for fixing a ring frame 5 as illustrated in the figure.

(Base Film)

The base film 3 is not particularly limited, and examples thereof include films formed of low density polyethylene (LDPE), linear low density polyethylene (LLDPE), an ethylene-propylene copolymer, polypropylene, polybutene, polybutadiene, polymethylpentene, an ethylene-vinyl acetate copolymer, an ethylene-(meth)acrylic acid copolymer, an ethylene-methyl (meth)acrylate copolymer, an ethylene-ethyl (meth)acrylate copolymer, polyvinyl chloride, a vinyl chloride-vinyl acetate copolymer, a polyurethane film, and an ionomer. In the present specification, the concept of "(meth)acryl" includes both acryl and methacryl.

Further, in a case where the support sheet is required to have high heat resistance, examples of the base film 3 include a polyester film such as polyethylene terephthalate, polybutylene terephthalate, or polyethylene naphthalate, and a polyolefin film such as polypropylene or polymethyl pentene. In addition, crosslinked films of these or modified films using radiation, electric discharge, and the like can also be used. The base film may be a laminate of the above-described films.

Further, these films can be used by laminating two or more films thereof or by combining the films. Further, films obtained by coloring these films or performing printing thereon can also be used. Further, the films may be formed into a sheet by performing extrusion molding a thermoplastic resin or may be stretched. Further, films formed into a sheet by thinning and curing a curable resin through predetermined means may be used.

The thickness of the base film is not particularly limited, but is preferably in a range of 30 to 300 μm and more preferably in a range of 50 to 200 μm. By setting the thickness of the base film to be in the above-described range, rupture of the base film is unlikely to occur even in a case where cutting is performed by means of dicing. Further, since the flexibility is sufficiently imparted to the film-shaped fired material with a support sheet, the film-shaped fired material exhibits excellent adhesiveness to a work (for example, a semiconductor wafer).

The base film can be obtained by coating the surface with a release agent and performing a peeling treatment. As the release agent used for the peeling treatment, an alkyd-based release agent, a silicone-based release agent, a fluorine-based release agent, an unsaturated polyester-based release agent, a polyolefin-based release agent, or a wax-based release agent is used. Among these, from the viewpoint of heat resistance, an alkyd-based release agent, a silicone-based release agent, or a fluorine-based release agent is particularly preferable.

In order to perform the peeling treatment on the surface of the base film using the release agent, the surface thereof is coated with the release agent in the absence of a solvent or after being diluted with a solvent or emulsified, using a gravure coater, a Meyer bar coater, an air knife coater, or a roll coater, and the base film coated with the release agent is provided at room temperature or under a heating condition or may be cured by electron beams to form a laminate through wet lamination, dry lamination, hot melt lamination, melt extrusion lamination, or coextrusion process.

(Pressure-Sensitive Adhesive Layer)

The support sheet 2 has a pressure-sensitive adhesive portion on at least the outer peripheral portion thereof. It is preferable that the pressure-sensitive adhesive portion have a function of temporarily fixing the ring frame 5 on the outer peripheral portions of film-shaped fired material with a support sheet 100*a* and 100*b*, and the ring frame 5 is peelable after required steps are carried out. Therefore, as the pressure-sensitive adhesive layer 4, a layer with low tackiness may be used, or an energy ray curable layer having an adhesive strength which is decreased at the time of irradiation with energy rays may be used. A removable pressure-sensitive adhesive layer can be formed using various known pressure-sensitive adhesives of the related art (for example, a general purpose pressure-sensitive adhesive such as a rubber-based pressure-sensitive adhesive, an acrylic pressure-sensitive adhesive, a silicone-based pressure-sensitive adhesive, a urethane-based pressure-sensitive adhesive, or a vinyl ether-based pressure-sensitive adhesive, a pressure-sensitive adhesive with surface unevenness, an energy ray curable pressure-sensitive adhesive, or a thermal expansion component-containing pressure-sensitive adhesive).

The support sheet 2 is a pressure-sensitive adhesive sheet having a typical configuration provided with the pressure-sensitive adhesive layer 4 on the entire upper surface of the base film 3 as illustrated in FIG. 4. Alternatively, the support sheet may have a configuration in which the surface of the pressure-sensitive adhesive layer 4 on the inner peripheral portion is covered with the film-shaped fired material and the pressure-sensitive adhesive portion is exposed to the outer peripheral portion. In this case, the outer peripheral portion of the pressure-sensitive adhesive layer 4 is used for fixing the above-described ring frame 5, and the film-shaped fired material is peelably laminated on the inner peripheral portion. As the pressure-sensitive adhesive layer 4, a layer with low tackiness may be used in the same manner as described above, or an energy ray curable pressure-sensitive adhesive may be used.

In the configuration illustrated in FIG. 5, the ring-shaped pressure-sensitive adhesive layer 4 is formed on the outer peripheral portion of the base film 3 and is set as a pressure-sensitive adhesive portion. At this time, the pressure-sensitive adhesive layer 4 may be a single pressure-sensitive adhesive layer formed of the pressure-sensitive adhesive or may be obtained by circularly cutting double-sided pressure-sensitive adhesive tape containing a pressure-sensitive adhesive layer formed of the pressure-sensitive adhesive.

As a weak pressure-sensitive adhesive, an acrylic pressure-sensitive adhesive or a silicone-based pressure-sensitive adhesive is preferably used. Further, in consideration of the releasability of the film-shaped fired material, the adhesive strength of the pressure-sensitive adhesive layer 4 on a SUS plate at 23° C. is preferably in a range of 30 to 120 mN/25 mm, more preferably in a range of 50 to 100 mN/25 mm, and still more preferably in a range of 60 to 90 mN/25 mm. In a case where the adhesive strength is extremely low, the adhesiveness between the film-shaped fired material 1 and the pressure-sensitive adhesive layer 4 becomes insufficient. As a result, the film-shaped fired material and the pressure-sensitive adhesive layer may be peeled from each other in the dicing step or the ring frame may drop off. Further, in a case where the adhesive strength is extremely high, the film-shaped fired material and the pressure-sensitive adhesive layer are in close contact with each other and this may cause pickup failure.

In a case where a removable pressure-sensitive adhesive layer which is curable by energy rays is used in the support sheet with the configuration of FIG. 4, the releasability may be decreased by irradiating a region where the film-shaped fired material is laminated with energy rays in advance. At this time, the adhesive strength in other regions may be maintained to be high without performing irradiation with energy rays for the purpose of bonding the ring frame 5. In order to not irradiate other regions with energy rays, for example, irradiation with energy rays may be performed from the base film side by providing an energy ray shielding layer in regions corresponding to other regions of the base film through printing or the like. In the support sheet with the configuration of FIG. 4, the surface where the pressure-sensitive adhesive layer 4 of the base film 3 is provided can be subjected to a roughening treatment such as sand blasting or a solvent treatment or an oxidation treatment such as a corona discharge treatment, irradiation with electron beams, a plasma treatment, an ozone ultraviolet irradiation treatment, a flame treatment, a chromic acid treatment or an hot air treatment as desired, for the purpose of strengthening bonding between the base film 3 and the pressure-sensitive adhesive layer 4. In addition, a primer treatment can be performed.

The thickness of the pressure-sensitive adhesive layer 4 is not particularly limited, but is preferably in a range of 1 to 100 μm, more preferably in a range of 2 to 80 μm, and particularly preferably in a range of 3 to 50 μm.

(Film-Shaped Fired Material With Support Sheet)

The film-shaped fired material with a support is formed such that the film-shaped fired material is temporarily and peelably attached to the inner peripheral portion of a support sheet having a pressure-sensitive adhesive portion on the outer peripheral portion. In the configuration example illustrated in FIG. 4, the film-shaped fired material with a support sheet 100*a* is formed such that the film-shaped fired material 1 is peelably laminated on the inner peripheral portion of the support sheet 2 formed of the base film 3 and the pressure-sensitive adhesive layer 4, and the pressure-sensitive adhesive layer 4 is exposed to the outer peripheral portion of the support sheet 2. In this configuration example, it is preferable that the film-shaped fired material 1 having a diameter smaller than the diameter of the support sheet 2 is concentrically laminated on the pressure-sensitive adhesive layer 4 of the circular support sheet 2.

The film-shaped fired material with a support sheet 100*a* having the above-described configuration is attached to the ring frame 5 in the pressure-sensitive adhesive layer 4 exposed to the outer peripheral portion of the support sheet 2.

Further, cyclic double-sided tape or a pressure-sensitive adhesive layer may be separately provided on the paste (the pressure-sensitive adhesive layer exposed to the outer peripheral portion of the pressure-sensitive adhesive sheet) with respect to the ring frame. The double-sided tape has a configuration of a pressure-sensitive adhesive layer, a core material, and a pressure-sensitive adhesive layer, and the pressure-sensitive adhesive layer in the double-sided tape is not particularly limited, and a pressure-sensitive adhesive such as a rubber-based pressure-sensitive adhesive, an acrylic pressure-sensitive adhesive, a silicone-based pressure-sensitive adhesive, or polyvinyl ether is used. The pressure-sensitive adhesive layer is attached to the ring frame on the outer peripheral portion at the time of production of an element described below. Preferred examples of the core material of the double-sided tape include a polyester film, a polypropylene film, a polycarbonate film, a polyimide film, a fluorine resin film, and a liquid crystal polymer film.

Figure 6:
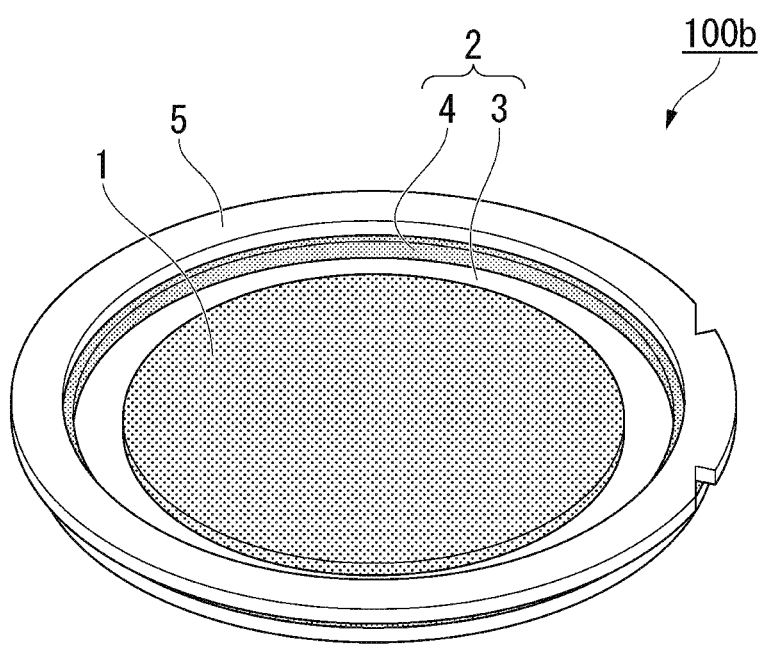
FIG. 6 is a perspective view schematically illustrating a state in which the film-shaped fired material with a support sheet according to an embodiment of the present invention is attached to a ring frame.

In the configuration example illustrated in FIG. 5, the ring-shaped pressure-sensitive adhesive layer 4 is formed on the outer peripheral portion of the base film 3 and is set as a pressure-sensitive adhesive portion. FIG. 6 is a perspective view illustrating the film-shaped fired material with a support sheet 100*b* illustrated in FIG. 5. At this time, the pressure-sensitive adhesive layer 4 may be a single pressure-sensitive adhesive layer formed of the pressure-sensitive adhesive or may be obtained by circularly cutting double-sided pressure-sensitive adhesive tape containing a pressure-sensitive adhesive layer formed of the pressure-sensitive adhesive. The film-shaped fired material 1 is peelably laminated on the inner peripheral portion of the base film 3 enclosed by the pressure-sensitive adhesive portion. In this configuration example, the film-shaped fired material 1 having a diameter smaller than the diameter of the support sheet 2 is concentrically and peelably laminated on the base film 3 of the support sheet 2.

A release film may be provided on the film-shaped fired material with a support sheet for the purpose of surface protection in order to avoid contact of any one or both surfaces of the film-shaped fired material and the pressure-sensitive adhesive portion with the outside until the material is provided for use.

The surface protective film (release film) can be obtained by coating the surface of the base film such as polyethylene, polyethylene terephthalate, polybutylene terephthalate, polyethylene naphthalate, or polypropylene exemplified above with a release agent and performing a peeling treatment. As the release agent used for the peeling treatment, an alkyd-based release agent, a silicone-based release agent, a fluorine-based release agent, an unsaturated polyester-based release agent, a polyolefin-based release agent, or a wax-based release agent is used. Among these, from the viewpoint of heat resistance, an alkyd-based release agent, a silicone-based release agent, or a fluorine-based release agent is particularly preferable.

In order to perform the peeling treatment on the surface of the base film using the release agent, the surface thereof is coated with the release agent in the absence of a solvent or after being diluted with a solvent or emulsified, using a gravure coater, a Meyer bar coater, an air knife coater, or a roll coater, and the base film coated with the release agent is provided at room temperature or under a heating condition or may be cured by electron beams to form a laminate through wet lamination, dry lamination, hot melt lamination, melt extrusion lamination, or coextrusion process.

The thickness of the film-shaped fired material with a support sheet is preferably in a range of 1 to 500 μm, more preferably in a range of 5 to 300 μm, and still more preferably in a range of 10 to 150 μm.

<<Method of Producing Film-Shaped Fired Material With Support Sheet>>

The film-shaped fired material with a support sheet can be produced by sequentially laminating the above-described respective layers so as to have the corresponding positional relationship.

For example, in a case where the pressure-sensitive adhesive layer or the film-shaped fired material is laminated on the base film, the release film is coated with the pressure-sensitive adhesive composition or fired material composition containing a component and a solvent for constituting the pressure-sensitive adhesive layer or the film-shaped fired material, the composition is dried as necessary to volatilize the solvent and obtain a film shape, the pressure-sensitive adhesive layer or the film-shaped fired material is formed on the release film in advance, and the surface of the base film is attached to the surface of the pressure-sensitive adhesive layer or film-shaped fired material after completion of the above-described formation on a side opposite to a side where the release film is provided. At this time, it is preferable that the surface of the release film on which the peeling treatment has been performed is coated with the pressure sensitive adhesive composition or fired material composition. The release film may be removed after formation of the laminated structure as necessary.

For example, in a case where a film-shaped fired material with a support sheet (a film-shaped fired material with a support sheet, in which the support sheet is a laminate of the base film and the pressure-sensitive adhesive layer) formed by laminating the pressure-sensitive adhesive layer on the base film and laminating the film-shaped fired material on the pressure-sensitive adhesive layer is produced, the pressure-sensitive adhesive layer is laminated on the base film according to the above-described method, the release film is separately coated with the fired material composition containing a component and a solvent for constituting the film-shaped fired material, the composition is dried as necessary to volatilize the solvent and obtain a film shape so that the film-shaped fired material is formed on the release film, the exposed surface of this film-shaped fired material is attached to the exposed surface of the pressure-sensitive adhesive layer after being laminated on the base material, and the film-shaped fired material is laminated on the pressure-sensitive adhesive layer, thereby obtaining a film-shaped fired material with a support sheet. Even in a case where the film-shaped fired material is formed on the release film, it is preferable that the surface of the release film on which the peeling treatment has been performed is coated with the fired material composition, and the release film may be removed after formation of the laminated structure as necessary.

As described above, since all layers other than the base material constituting the film-shaped fired material with a support sheet can be formed on the release film in advance and laminated using a method of bonding the layers to the surface of a target layer, the film-shaped fired material with a support sheet may be produced by appropriately selecting a layer that employs such a step as necessary.

Further, the film-shaped fired material with a support sheet may be stored in a state in which all the required layers are provided and then the release film is attached to the surface of the outermost layer on a side opposite to the support sheet.

<<Method of Producing Element>>

Next, a method of utilizing the film-shaped fired material with a support sheet according to the present invention will be described based on an example of a case where the fired material is used for production of an element (for example, a semiconductor element).

According to the embodiment of the present invention, the method of producing a semiconductor element obtained by using the film-shaped fired material with a support sheet is performed by peeling the release film off from the film-shaped fired material with a support sheet and attaching the film-shaped fired material with a support sheet to the rear surface of a semiconductor wafer (work) in which a circuit is formed on the surface thereof. The following steps (1) and (2) may be performed in order of the step (1) and the step (2), and the following steps (1) to (4) may be performed in order of the step (1), the step (2), the step (3), and the step (4).

Step (1): a step of dicing the semiconductor wafer (work) and the film-shaped fired material of the laminate formed by sequentially laminating the support sheet, the film-shaped fired material, and the semiconductor wafer (work)

Step (2): a step of peeling the support sheet off from the film-shaped fired material to obtain an element with the film-shaped fired material Step (3): a step of attaching the element with the film-shaped fired material to the surface of an adherend Step (4): a step of firing the film-shaped fired material and bonding the semiconductor element and the adherend Hereinafter, a case of performing the steps (1) to (4) will be described. The semiconductor wafer may be a silicon wafer or a silicon carbide wafer or may be a compound semiconductor wafer such as gallium arsenic. The circuit on the wafer surface can be formed according to various methods which have been commonly used in the related art such as an etching method and a lift-off method. Next, a surface (rear surface) of the semiconductor wafer opposite to the circuit surface is ground. The grinding method is not particularly limited, and the surface is ground by known means using a grinder. At the time of grinding the rear surface, a pressure-sensitive adhesive sheet which is referred to as a surface-protective sheet is attached to the circuit surface for the purpose of protecting the circuit on the surface. The grinding of the rear surface is carried out by fixing the circuit surface side (that is, the surface-protective sheet side) of the wafer using a chuck table or the like and grinding the rear surface side where the circuit is not formed using a grinder. The thickness of the wafer after being ground is not particularly limited, but is typically in a range of 20 to 500 μm. Next, a fractured layer generated during the grinding of the rear surface is removed as necessary. The fractured layer is removed by performing chemical etching, plasma etching, or the like.

Next, the film-shaped fired material of the film-shaped fired material with a support sheet is attached to the rear surface of the semiconductor wafer. Thereafter, the steps (1) to (4) are performed in order of the step (1), the step (2), the step (3), and the step (4).

The laminate of the semiconductor wafer, the film-shaped fired material, and the support sheet is diced for each circuit formed on the surface of the wafer to obtain a laminate of the semiconductor element, the film-shaped fired material, and the support sheet.

The dicing is performed by cutting the wafer and the film-shaped fired material simultaneously. According to the film-shaped fired material with a support sheet according to the present embodiment, since the adhesive strength is exhibited between the film-shaped fired material and the support sheet during the dicing, chipping and element flying can be prevented. Therefore, the dicing adaptability is excellent. The dicing is not particularly limited, and examples of the dicing method include a method of fixing the peripheral portion (an outer peripheral portion of a support) of the support sheet with the ring frame at the time of dicing the wafer and singulating the wafer according to a known technique of using a rotary round blade such as a dicing blade. The film-shaped fired material may be completely cut, and the cut depth of the support sheet resulting from dicing is preferably in a range of 0 to 30 μm from the interface between the film-shaped fired material and the support sheet. By decreasing the amount of the support sheet to be cut, it is possible to suppress fusing of the pressure-sensitive adhesive layer or the base film constituting the support sheet caused by the friction of the dicing blade or generation of burrs and the like.

Thereafter, the support sheet may be expanded. In a case where a base film having excellent extensibility is selected as the base film of the support sheet, the support sheet has excellent expandability. By picking up the diced semiconductor element with a film-shaped fired material by general means such as a collet, the film-shaped fired material and the support sheet are peeled from each other. As a result, a semiconductor element (a semiconductor element with a film-shaped fired material) having a film-shaped fired material on the rear surface is obtained.

Next, the element with the film-shaped fired material is attached to the surface of the adherend such as a substrate, a ring frame, and a heat sink.

Next, the film-shaped fired material is fired so that the element and the adherend such as a substrate, a ring frame, or a heat sink are sintered and bonded to each other. At this time, in a case where the exposed surface of the film-shaped fired material of the semiconductor element with the film-shaped fired material is attached to the adherend such as a substrate, a ring frame, or a heat sink, the semiconductor wafer (work) and the adherend can be sintered and bonded through the film-shaped fired material.

The heating temperature of firing the film-shaped fired material may be appropriately determined in consideration of the kind and the like of the film-shaped fired material, but is preferably in a range of 100° C. to 600° C., more preferably in a range of 150° C. to 550° C., and still more preferably in a range of 250° C. to 500° C. The heating time may be appropriately determined in consideration of the kind and the like of the film-shaped fired material, but is preferably in a range of 10 seconds to 60 minutes, more preferably in a range of 10 seconds to 30 minutes, and still more preferably in a range of 10 seconds to 10 minutes.

The film-shaped fired material may be fired by performing pressurizing and firing, in which the film-shaped fired material is fired by being pressurized. The condition for pressurization can be set to be, for example, in a range of 1 to 50 MPa.

According to the method of producing the element of the present embodiment, the film-shaped fired material with a highly uniform thickness can be simply formed on the rear surface of the element, and cracks after the dicing step or the packing are unlikely to be generated. Further, according to the method of producing the element of the present embodiment, the semiconductor element with the film-shaped fired material can be obtained without separately attaching the film-shaped fired material to the rear surface of the singulated semiconductor element, and thus the production step can be simplified. Further, a semiconductor device in which the semiconductor element and the adherend are sintered and bonded through the film-shaped fired material by disposing the semiconductor element with the film-shaped fired material on a desired adherend of a device substrate or the like and firing the semiconductor element can be produced.

As an embodiment, a semiconductor element with a film-shaped fired material which includes a semiconductor element and the film-shaped fired material is obtained. As an example, the semiconductor element with a film-shaped fired material can be produced using the method of producing the elements described above.

Further, in the above-described embodiment, the example of sintering and bonding the semiconductor element of the film-shaped fired material and the adherend has been described, but the target for sintering and bonding of the film-shaped fired material is not limited to the example described above, and the sintering and bonding can be performed on various products sintered in contact with the film-shaped fired material.

EXAMPLES

Hereinafter, the present invention will be described in detail based on the examples, and the scope of the present invention is not limited to these examples and the like.

<Production of Fired Material Composition>

Components used for producing a fired material composition will be described. Here, metal particles having a particle diameter of 100 nm or less are noted as "sinterable metal particles", and metal particles having a particle diameter of greater than 100 nm are noted as "non-sinterable metal particles".

(Sinterable Metal Particle Inclusion Paste Material)

Alconano Ag Paste ANP-1 (organic coated composite silver nanopaste, Nanoparticle Laboratory Corporation: alcohol derivative coated silver particles, metal content of 70 wt % or greater, 60 wt % or greater of silver particles with average particle diameter of 100 nm or less)

Alconano Ag Paste ANP-4 (organic coated composite silver nanopaste, Nanoparticle Laboratory Corporation: alcohol derivative coated silver particles, metal content of 80 wt % or greater, 25 wt % or greater of silver particles with average particle diameter of 100 nm or less)

(Binder Component)

Acrylic polymer 1 (2-ethylhexyl methacrylate polymer, weight-average molecular weight of 280000, L-0818, manufactured by The Nippon Synthetic Chemical Industry Co., Ltd., MEK diluted product, solid content of 54.5% by mass, Tg: −10° C. (calculated value using Fox's theoretical formula))

Acrylic polymer 2 (methyl acrylate/2-hydroxyethyl acrylate copolymer, copolymerization weight ratio of 85/15, weight-average molecular weight of 370000, N-4617, manufactured by The Nippon Synthetic Chemical Industry Co., Ltd., solvent diluted product in which ethyl acetate and toluene are mixed at mixing ratio of 1/1, solid content of 35.7% by mass, Tg: 4° C. (calculated value using Fox's theoretical formula))

Based on the formulation listed in Table 1, fired material compositions of Examples 1 and 2 and Comparative Examples 1 and 2 were obtained by mixing respective components. The value of each component in Table 1 indicates parts by mass.

Since the sinterable metal particle inclusion paste material is sold in a state of containing a high boiling point solvent and this solvent remains in the film-shaped fired material after coating or drying, the components of the sinterable metal particle inclusion paste material are described together with such components. In consideration of volatilization of the solvent in the binder component at the time of drying, the solid content is noted in terms of parts by mass by removing the solvent component.

<Production of Film-Shaped Fired Material>

One surface of a release film (SP-PET 381031, manufactured by Lintec Corporation, thickness of 38 μm) was coated with the fired material composition obtained in the above-described manner and dried at 110° C. for 4 minutes, thereby obtaining a film-shaped fired material having the thickness listed in Table 1.

<Method of Separating Sinterable Metal Particles and Non-Sinterable Metal Particles From Film-Shaped Fired Material and Component Obtained by Removing These Particles>

The film-shaped fired material before being fired and an organic solvent with an amount approximately ten times the amount of the film-shaped fired material on a weight basis were mixed, and the solution was allowed to stand for approximately 30 minutes until the sinterable metal particles and the non-sinterable metal particles were precipitated. The components obtained by removing the sinterable metal particles and the non-sinterable metal particles from the film-shaped fired material were batched off by eliminating the supernatant using a syringe and recovering residues after being dried at 120° C. for 10 minutes. An organic solvent with an amount approximately ten times the amount of the film-shaped fired material was mixed again with the liquid containing the sinterable metal particles and the non-sinterable metal particles after the supernatant was eliminated using a syringe, the solution was allowed to stand for approximately 30 minutes until the sinterable metal particles and the non-sinterable metal particles were precipitated, and the supernatant was eliminated using a syringe. The sinterable metal particles and the non-sinterable metal particles were batched off by repeating the process of mixing of the organic solvent, allowing the solution to stand, and eliminating the supernatant five or more times and recovering residues obtained by drying the remaining solution at 120° C. for 10 minutes.

<Evaluation of Film-Shaped Fired Material>

The obtained film-shaped fired materials were evaluated based on the following items.

(Measurement of TG/DTA in Air Atmosphere)

Figure 7:
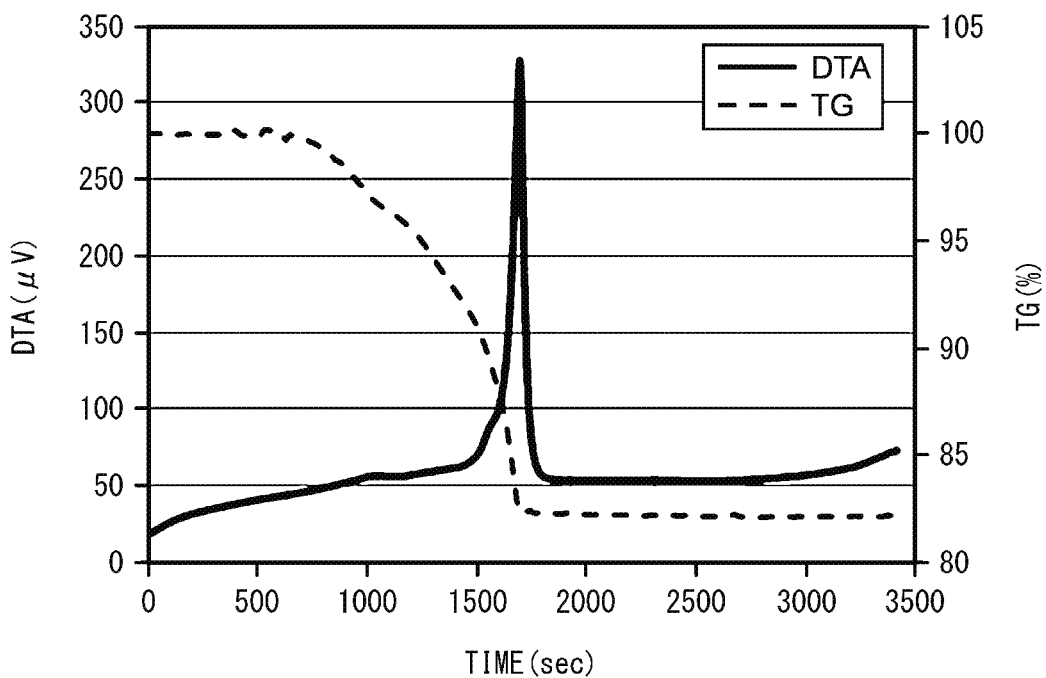
FIG. 7 is a graph showing a TG curve and a DTA curve obtained by performing measurement in an air atmosphere.
Figure 8:
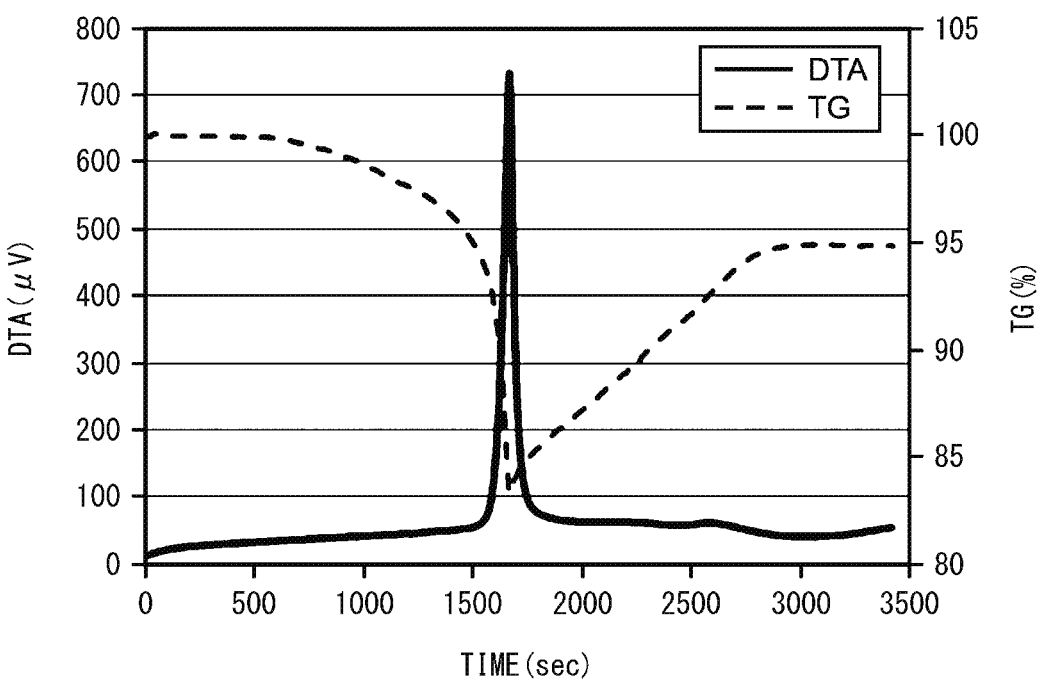
FIG. 8 is a graph showing a TG curve and a DTA curve obtained by performing measurement in an air atmosphere.
Figure 9:
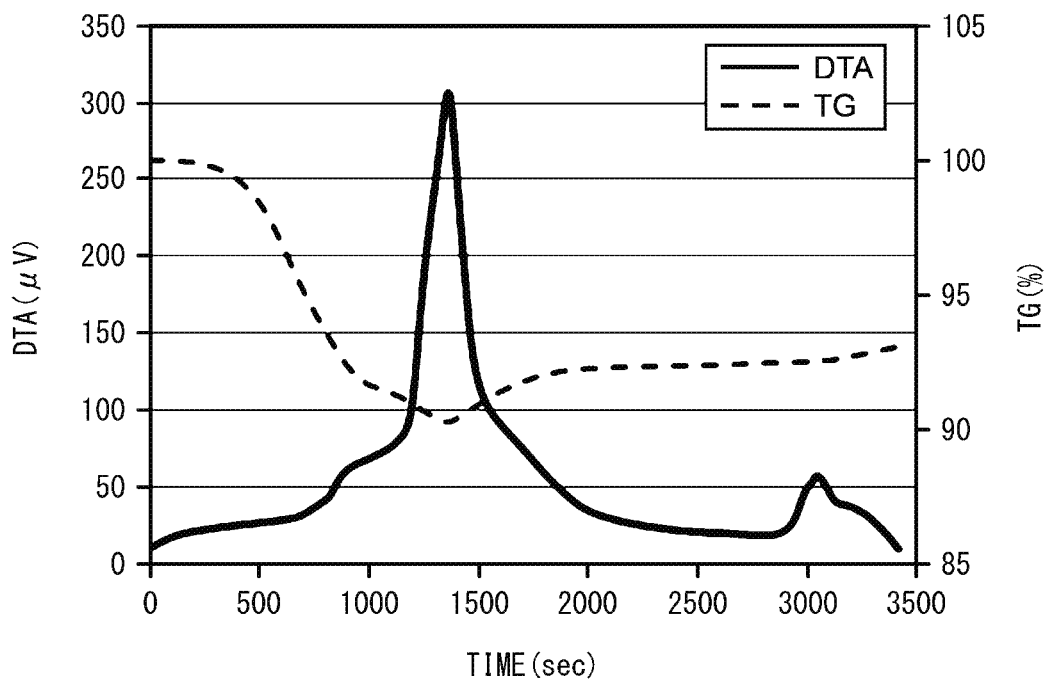
FIG. 9 is a graph showing a TG curve and a DTA curve obtained by performing measurement in an air atmosphere.
Figure 10:
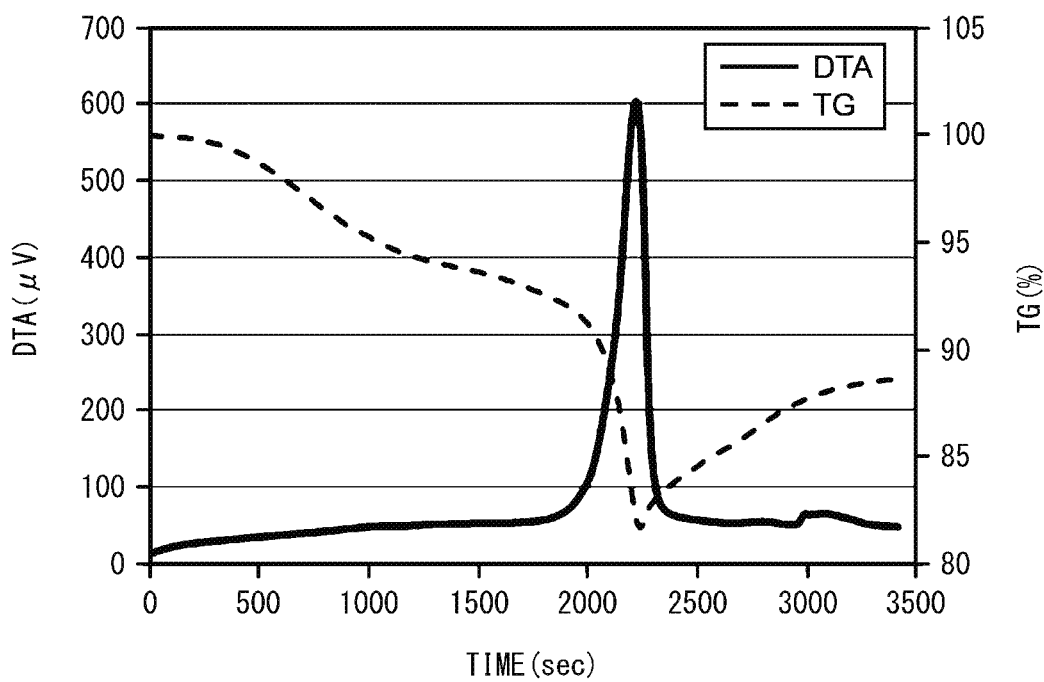
FIG. 10 is a graph showing a TG curve and a DTA curve obtained by performing measurement in an air atmosphere.

The TG curve and the DTA curve were acquired by performing measurement in a temperature range of 40° C. to 600° C. at a temperature-rising-rate of 10° C./min in an air atmosphere using alumina particles having almost the same amount as the amount of the measurement sample as a reference sample, using a thermal analysis measuring device (thermal analyzer TG/DTA simultaneous measuring device, DTG-60, manufactured by Shimadzu Corporation) with respect to the obtained film-shaped fired materials. The results of Example 1 are shown in FIG. 7, the results of Example 2 are shown in FIG. 8, the results of Comparative Example 1 are shown in FIG. 9, and the results of Comparative Example 2 are shown in FIG. 10. Further, the time (A1) after the start of a temperature increase, at which a negative gradient was the highest, in the TG curve and the maximum peak time (B1) in a time range of 0 seconds to 2160 seconds after the start of a temperature increase in the DTA curve are listed in Table 1.

Further, according to the separation method, the time (A1') after the start of a temperature increase, at which a negative gradient was the highest, in the TG curve and the peak time (B1') observed in a shortest time among peaks observed in a time range of 960 seconds to 2160 seconds after the start of a temperature increase in the DTA curve with respect to the component obtained by removing the sinterable metal particles and the non-sinterable metal particles from the film-shaped fired material are listed in Table 1.

(Measurement of TG/DTA in Nitrogen Atmosphere)

Figure 11:
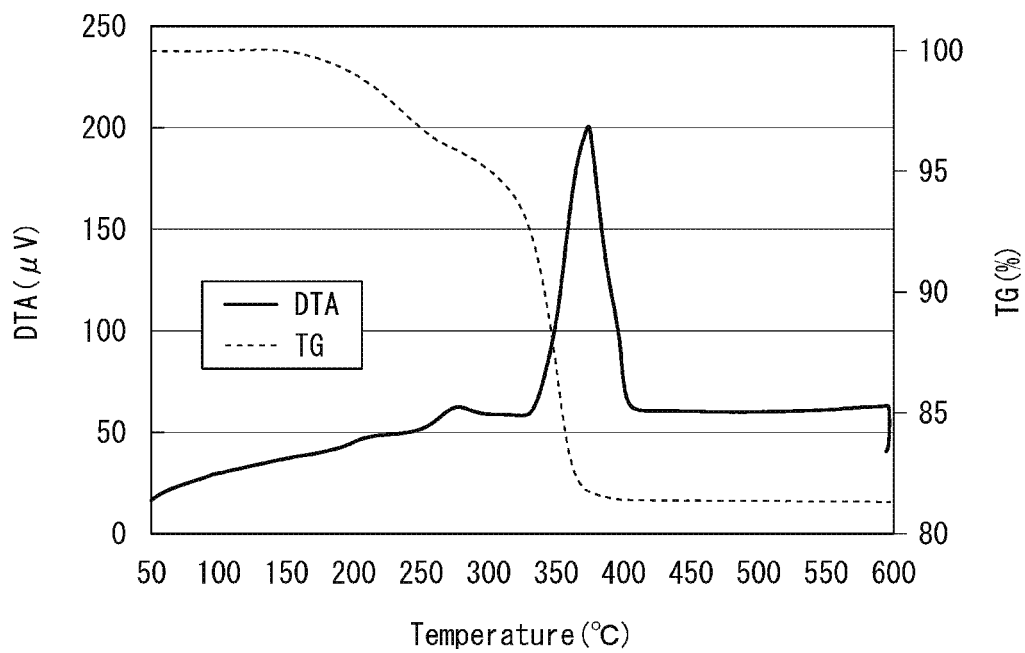
FIG. 11 is a graph showing a TG curve and a DTA curve obtained by performing measurement in a nitrogen atmosphere.
Figure 12:
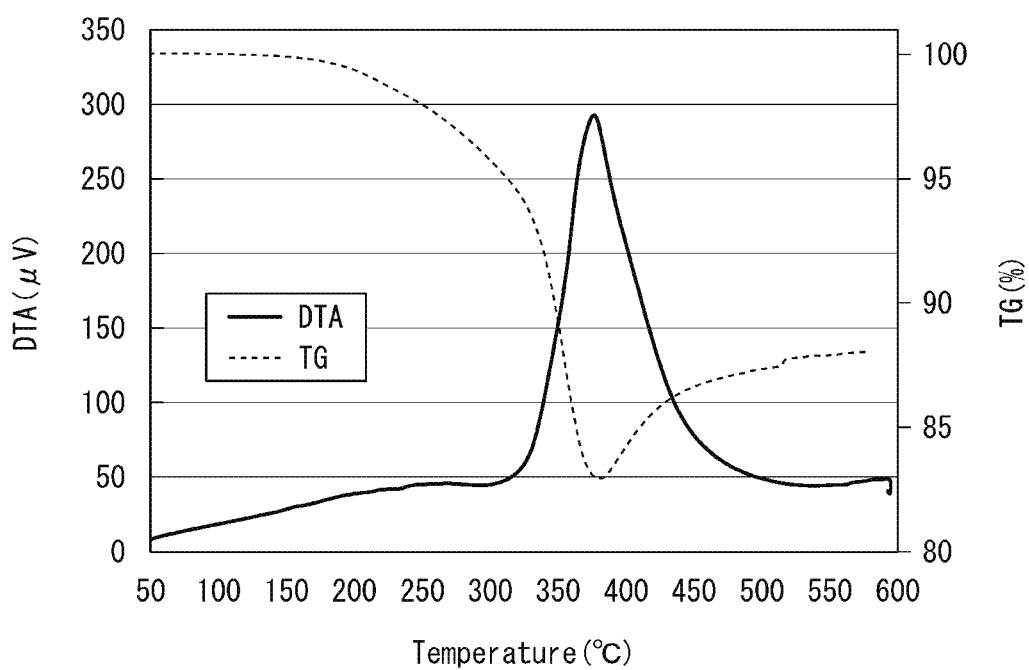
FIG. 12 is a graph showing a TG curve and a DTA curve obtained by performing measurement in a nitrogen atmosphere.
Figure 13:
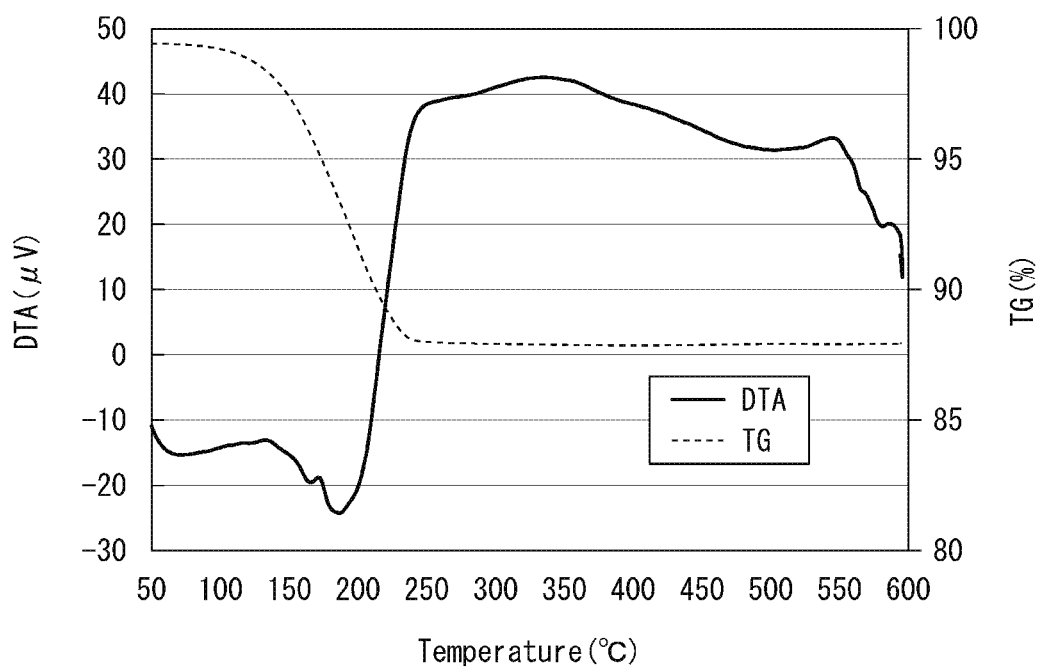
FIG. 13 is a graph showing a TG curve and a DTA curve obtained by performing measurement in a nitrogen atmosphere.
Figure 14:
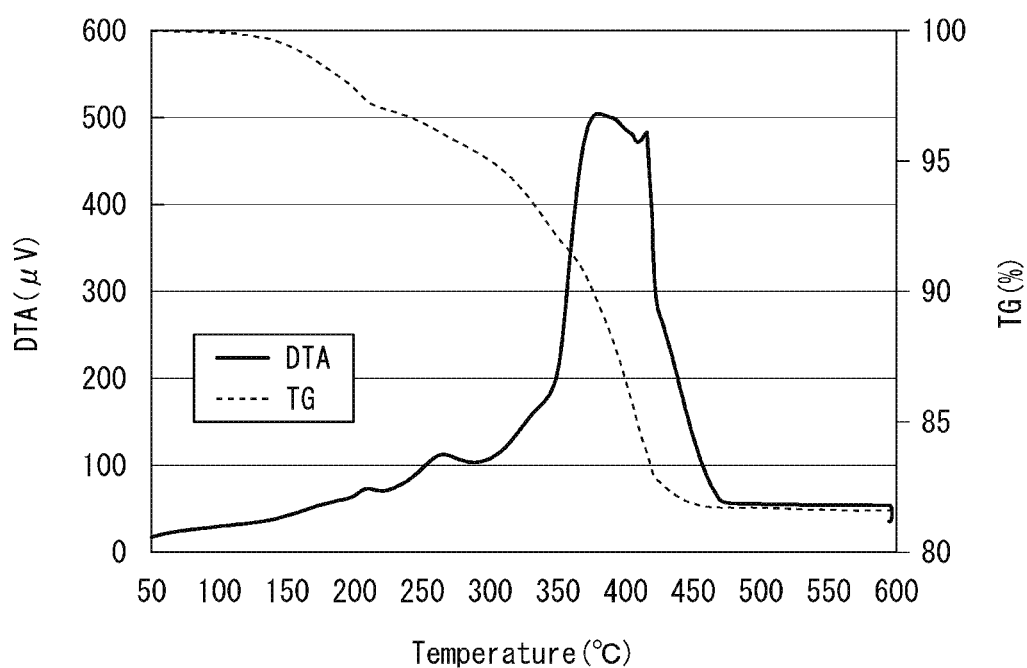
FIG. 14 is a graph showing a TG curve and a DTA curve obtained by performing measurement in a nitrogen atmosphere.

The TG curve and the DTA curve were acquired by performing measurement at a temperature-rising-rate of 10° C./min in a nitrogen atmosphere using alumina particles having almost the same amount as the amount of the measurement sample as a reference sample, using a thermal analysis measuring device (thermal analyzer TG/DTA simultaneous measuring device, DTG-60, manufactured by Shimadzu Corporation) with respect to the obtained film-shaped fired materials. The results of Example 1 are shown in FIG. 11, the results of Example 2 are shown in FIG. 12, the results of Comparative Example 1 are shown in FIG. 13, and the results of Comparative Example 2 are shown in FIG. 14. Further, the temperature (A2) at which a negative gradient was the highest in the TG curve and the maximum peak temperature (B2) in a temperature range of 25° C. to 400° C. in the DTA curve are listed in Table 1.

Further, according to the separation method, the temperature (A2') at which a negative gradient was the highest in the TG curve and the maximum peak temperature (B2') observed at a lowest temperature among peaks observed in a temperature range of 200° C. to 400° C. in the DTA curve with respect to the component obtained by removing the sinterable metal particles and the non-sinterable metal particles from the film-shaped fired material are listed in Table 1.

(Measurement of Shear Adhesive Strength)

The shear adhesive strength after the film-shaped fired material was fired was measured according to the following method.

The obtained film-shaped fired material was cut into a size of 10 mm×10 mm and attached to the upper surface of a copper adherend having a cross section with a diameter of 10 mm, a height of 5 mm, and a cylindrical shape, a copper adherend having a cross section with a diameter of 5 mm, a height of 2 mm, and a cylindrical shape was placed thereon, and the resultant was pressurized and fired under following conditions of (1) to (3) in an air atmosphere or a nitrogen atmosphere, thereby obtaining a test piece for measuring the bonding adhesive strength. A force was applied to the bonding surface of this test piece at room temperature at a rate of 6 mm/min in a shear direction to measure the strength at the time of damage to the test piece in the bonding state, and the average value of the values obtained under conditions showing the highest bonding adhesive strength among the obtained measurement results of the test piece under the condition for pressurizing and firing was used as the shear adhesive strength. The results are listed in Table 1.

(1) 300° C. for 3 minutes at 30 MPa
(2) 350° C. for 3 minutes at 10 MPa
(3) 400° C. for 3 minutes at 10 MPa (Measurement of Thickness)

The thickness was measured using a constant pressure thickness-measuring device (product name: "PG-02", manufactured by Techlock, Inc.) in conformity with JIS K7130.

present invention. Further, the present invention is not limited to the embodiments and only limited by the scope of the claims.

INDUSTRIAL APPLICABILITY

According to the present invention, it is possible to provide a film-shaped fired material which has excellent thickness stability and thermal conductivity and exhibits excellent shear adhesive strength after being fired. Further, it is possible to provide a film-shaped fired material with a support sheet which includes the film-shaped fired material and is used for sinter bonding of a semiconductor element.

REFERENCE SIGNS LIST

1: film-shaped fired material
1c: fired material
10, 11: sinterable metal particles
20, 21: binder component
100: film-shaped fired material with support sheet
2: support sheet
3: base film
4: pressure-sensitive adhesive layer
5: ring frame

The invention claimed is:

1. A film-shaped fired material, comprising:
sinterable metal particles; and
a binder component,
wherein the binder component is a resin which comprises a constituent unit derived from methacrylate,
wherein a content of the constituent unit derived from methacrylate with respect to a total amount of constituent units in the resin is 50% to 100% by mass,
wherein a time (A1) after the start of a temperature increase, at which a negative gradient is the highest, in

TABLE 1

|  |  |  | Example 1 | Example 2 | Comparative Example 1 | Comparative Example 2 |
|---|---|---|---|---|---|---|
| Fired material composition | Sinterable metal particle inclusion paste material | ANP-1 | 87.7 |  |  |  |
|  |  | ANP-4 |  | 86.8 | 100 | 86.8 |
|  | Binder component | Acrylic polymer 1 | 12.3 |  |  |  |
|  |  | Acrylic polymer 2 |  | 13.2 |  | 13.2 |
| Form at room temperature |  |  | Film | Film | Paste | Film |
| Thickness [μm] |  |  | 75 | 75 | — | 75 |
| Condition for pressurizing and firing |  |  | 350° C. for 3 minutes 10 MPa | 350° C. for 3 minutes 10 MPa | 300° C. for 3 minutes 30 MPa | 400° C. for 3 minutes 10 MPa |
| TG/DTA measurement in air atmosphere | TG time (A1) [s] |  | 1666 | 1649 | 605 | 2177 |
|  | DTA time (B1) [s] |  | 1691 | 1667 | 1360 | 2218 |
|  | (B1 − A1) [s] |  | 25 | 18 | 755 | 41 |
|  | TG time (A1') [s] |  | 1397 | 1397 | 1065 | 2274 |
|  | DTA time (B1') [s] |  | 1120 | 1272 | 1272 | 1272 |
| TG/DTA measurement in nitrogen atmosphere | TG temperature (A2) [° C.] |  | 350 | 354 | 198 | 406 |
|  | DTA temperature (B2) [° C.] |  | 374 | 378 | 337 | 380 |
|  | (B2 − A2) [° C.] |  | 24 | 24 | 139 | −26 |
|  | TG temperature (A2') [° C.] |  | 310 | 310 | 174 | 413 |
|  | DTA temperature (B2') [° C.] |  | 259 | 265 | 265 | 269 |
| Shear adhesive strength (pressurizing and firing in air atmosphere) [MPa] |  |  | 86 | 61 | 44 | 28 |
| Shear adhesive strength (pressurizing and firing in nitrogen atmosphere) [MPa] |  |  | 93 | 73 | 50 | 38 |

The film-shaped fired material of Examples 1 and 2 had higher shear adhesive strength than those of the fired material of Comparative Examples 1 and 2.

Each configuration in each embodiment and the combination thereof are merely examples, and addition, omission, substitution, and other modification of configurations can be made within a range not departing from the scope of the a thermogravimetric curve (TG curve) measured from 40° C. to 600° C. at a temperature-rising-rate of 10° C./min in an air atmosphere and a maximum peak time (B1) in a time range of 0 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample satisfy a relationship of "A1<B1<A1+200 seconds" and a relationship of "A1<2000 seconds", and wherein a content of the binder component with respect to 100% by mass which is a total content of a solid content in the film-shaped fired material is 10% to 20% by mass.

2. The film-shaped fired material according to claim 1, wherein a time (A1'), after the start of a temperature increase, at which a negative gradient is the highest, in a thermogravimetric curve (TG curve) measured from 40° C. to 600° C. at a temperature-rising-rate of 10° C./min in an air atmosphere with respect to a component obtained by removing the sinterable metal particles from the film-shaped fired material and a peak time (B1') observed in a shortest time among peaks observed in a time range of 960 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample with respect to the sinterable metal particles satisfy a relationship of B1'<A1'.

3. The film-shaped fired material according to claim 1, wherein an endothermic peak is not present in a time range of 0 seconds to 2160 seconds after the start of a temperature increase in a differential thermal analysis curve (DTA curve) measured from 40° C. to 600° C. at a temperature-rising-rate of 10° C./min in an air atmosphere using alumina particles as a reference sample with respect to the film-shaped fired material.

4. A film-shaped fired material, comprising:
sinterable metal particles; and
a binder component,
wherein the binder component is a resin which comprises a constituent unit derived from methacrylate,
wherein a content of the constituent unit derived from methacrylate with respect to a total amount of constituent units in the resin is 50% to 100% by mass,
wherein a temperature (A2), at which a negative gradient is the highest, in a thermogravimetric curve (TG curve) measured at a temperature-rising-rate of 10° C./min in a nitrogen atmosphere and a maximum peak temperature (B2) in a temperature range of 25° C. to 400° C. in a differential thermal analysis curve (DTA curve) measured at a temperature-rising-rate of 10° C./min in a nitrogen atmosphere using alumina particles as a reference sample satisfy a relationship of "A2<B2<A2+60° C.", and wherein a content of the binder component with respect to 100% by mass which is a total content of a solid content in the film-shaped fired material is 10% to 20% by mass.

5. The film-shaped fired material according to claim 4, wherein a temperature (A2'), at which a negative gradient is the highest, in a thermogravimetric curve (TG curve) measured at a temperature-rising-rate of 10° C./min in a nitrogen atmosphere with respect to a component obtained by removing the sinterable metal particles from the film-shaped fired material and a peak temperature (B2') observed at a lowest temperature among peaks observed in a temperature range of 200° C. to 400° C. in a differential thermal analysis curve (DTA curve) measured at a temperature-rising-rate of 10° C./min in a nitrogen atmosphere using alumina particles as a reference sample with respect to the sinterable metal particles satisfy a relationship of B2'<A2'.

6. The film-shaped fired material according to claim 4, wherein an endothermic peak is not present in a temperature range of 25° C. to 400° C. in a differential thermal analysis curve (DTA curve) measured at a temperature-rising-rate of 10° C./min in a nitrogen atmosphere using alumina particles as a reference sample with respect to the film-shaped fired material.

7. The film-shaped fired material according to claim 1, wherein the sinterable metal particles are silver nanoparticles.

8. A film-shaped fired material with a support sheet, comprising:
the film-shaped fired material according to claim 1; and
a support sheet provided on at least one side of the film-shaped fired material.

9. The film-shaped fired material with a support sheet according to claim 8,
wherein the support sheet is provided with a pressure-sensitive adhesive layer on a base film, and
the film-shaped fired material is provided on the pressure-sensitive adhesive layer.

10. The film-shaped fired material according to claim 1, wherein a glass transition temperature of the resin is −20 C or higher and lower than 0 C.

11. The film-shaped fired material according to claim 4, wherein a glass transition temperature of the resin is −20 C or higher and lower than 0 C.

* * * * *